United States Patent
Akagawa et al.

(10) Patent No.: US 9,419,187 B2
(45) Date of Patent: Aug. 16, 2016

(54) LIGHT EMITTING DEVICE AND METHOD OF MANUFACTURING THEREOF

(71) Applicant: Nichia Corporation, Anan-shi (JP)

(72) Inventors: Seitaro Akagawa, Komatsushima (JP); Tomokazu Yoshida, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/657,676

(22) Filed: Mar. 13, 2015

(65) Prior Publication Data
US 2015/0263245 A1    Sep. 17, 2015

(30) Foreign Application Priority Data

Mar. 14, 2014 (JP) .................. 2014-052797
Mar. 10, 2015 (JP) .................. 2015-047606

(51) Int. Cl.

| | |
|---|---|
| *H01L 29/15* | (2006.01) |
| *H01L 33/00* | (2010.01) |
| *H01L 33/50* | (2010.01) |
| *C09K 11/00* | (2006.01) |
| *C09K 11/61* | (2006.01) |
| *C09K 11/77* | (2006.01) |

(52) U.S. Cl.
CPC ............ *H01L 33/502* (2013.01); *C09K 11/00* (2013.01); *C09K 11/617* (2013.01); *C09K 11/7734* (2013.01); *H01L 2933/0041* (2013.01)

(58) Field of Classification Search
None
See application file for complete search history.

(56) References Cited

U.S. PATENT DOCUMENTS

| 8,057,706 B1 | 11/2011 | Setlur et al. |
| 2011/0043101 A1* | 2/2011 | Masuda ............ C09K 11/0883 313/503 |
| 2012/0112623 A1 | 5/2012 | Kobashi |
| 2012/0266942 A1* | 10/2012 | Komatsu ............ C09K 11/7734 136/247 |

FOREIGN PATENT DOCUMENTS

| JP | 2011-054958 A | 3/2011 |
| JP | 2012-114416 A | 6/2012 |
| JP | 2013-533363 A | 8/2013 |
| JP | 2013-183042 A | 9/2013 |

* cited by examiner

*Primary Examiner* — Calvin Choi
*Assistant Examiner* — Xiaoming Liu
(74) *Attorney, Agent, or Firm* — Foley & Lardner LLP

(57) ABSTRACT

A light emitting device includes a package having side walls which define a recess, a light emitting element arranged in the recess, and a sealing member which seals the light emitting element. The sealing member includes a first portion which contains a fluorescent material and covers the light emitting element, and a second portion which does not contain a fluorescent material and is arranged over the first portion. The fluorescent material is a fluoride fluorescent material activated with tetravalent manganese represented by the following formula (I). The particles of the fluorescent material has a surface region with a tetravalent manganese ion concentration is lower than inner side.

$$A_2[M_{1-b}Mn^{4+}{}_bF_6] \qquad (I)$$

In the formula (I), A is a cation which contains K+ and may contain at least one selected from the group consisting of $Li^+$, $Na^+$, $Rb^+$, $Cs^+$, and $NH_4^+$, M is at least one of 15 Group 4 and Group 14 elements, and $0<b<0.2$.

11 Claims, 2 Drawing Sheets

LIGHT EMITTING DEVICE AND METHOD OF MANUFACTURING THEREOF

CROSS-REFERENCE TO RELATED APPLICATION

This application claims priority to Japanese Patent Application No. 2014-052797, filed on Mar. 14, 2014 and Japanese Patent Application No. 2015-047606, filed on Mar. 10, 2015. The entire disclosures of Japanese Patent Application No. 2014-052797 and No. 2015-047606 are hereby incorporated herein by reference.

BACKGROUND OF THE INVENTION

1. Field of the Invention

The present disclosure relates to a light emitting device and a method of manufacturing the light emitting device.

2. Description of the Related Art

A light emitting diodes (LEDs) is a semiconductor light emitting element produced from a metal compound such as gallium nitride (GaN). Combining such a semiconductor light emitting element and a fluorescent material, various light emitting devices to emit light of a while color, an incandescent lamp color, an orange color and so on have been developed. Those light emitting devices to emit a white light and so on can be obtained based on the principle of light-color mixing. As for the system to emit a white light, there are well-known systems such as a system which employs an ultraviolet-light emitting element and three types of fluorescent materials which emit lights of a red (R) color, green (G) color, and blue (B) color, respectively, and a system which employs a blue-light emitting element and a yellow-light emitting fluorescent material. Light emitting devices of the type which employ a blue-light emitting element and a fluorescent material to emit yellow light etc., are in demand in a wide range of fields such as general lighting, on-vehicle lighting, displays, backlights for liquid crystal devices. Of those, for the fluorescent materials used for a backlight of liquid crystal device, in order to reproduce a wide range of colors on a chromaticity diagram, high color purity is also demanded along with the light emitting efficiency. Particularly, the fluorescent materials used for backlights for liquid crystal devices are required to have compatibility in combination with a color filter, and for which, a fluorescent material with a narrow half width of the emission peak has been in demand.

Examples of known red fluorescent materials which have an excitation band in blue-color region and a narrow half width of the emission peak include fluoride fluorescent materials with compositions of:
$K_2AlF_5:Mn^{4+}$, $K_3AlF_6:Mn^{4+}$, $K_3GaF_6:Mn^{4+}$, $Zn_2AlF_7:Mn^{4+}$, $KIn_2F_7:Mn^{4+}$, $K_2SiF_6:Mn^{4+}$, $K_2TiF_6:Mn^{4+}$, $K_3ZrF_7:Mn^{4+}$, $Ba_{0.65}Zr_{0.35}F_{2.70}:Mn^{4+}$, $BaTiF_6:Mn^{4+}$, $K_2SnF_6:Mn^{4+}$, $Na_2TiF_6:Mn^{4+}$, $Na_2ZrF_6:Mn^{4+}$, $KRbTiF_6:Mn^{4+}$, and $K_2Si_{0.5}Ge_{0.5}F_6:Mn^{4+}$ (for example, see JP 2009-528429A).

Generally, in light emitting devices, in order to protect the light emitting element, the light emitting element together with the bonded wires and other electrically conductive members is sealed with a sealing material which contains a fluorescent material.

SUMMARY OF THE INVENTION

A light emitting device includes a package having side walls which define a recess, a light emitting element arranged in the recess, and a sealing member configured to seal the light emitting element. The sealing member includes a first portion which contains particles of a fluorescent material and covers the light emitting element, and a second portion which does not contain particles of the fluorescent material and is arranged over the first portion. The fluorescent material includes a fluoride fluorescent material activated with tetravalent manganese ion which has a chemical composition represented by the following formula (I) and the particles of the fluoride fluorescent material have a surface region where a tetravalent manganese ion concentration is lower than that in an inner region.

$$A_2[M_{1-b}Mn^{4+}{}_bF_6] \tag{I}$$

In the formula (I), A is a cation which contains at least $K^+$ and may further contain at least one selected from the group consisting of $Li^+$, $Na^+$, $Rb^+$, $Cs^+$ and $NH_4^+$, M is at least one selected from the group consisting of Group 4 elements and Group 14 elements, and $0<b<0.2$.

The light emitting device is provided in which reduction in the optical output and occurrence of deviation in chromaticity can be suppressed.

DETAILED DESCRIPTION OF THE EMBODIMENTS

Figure 1:
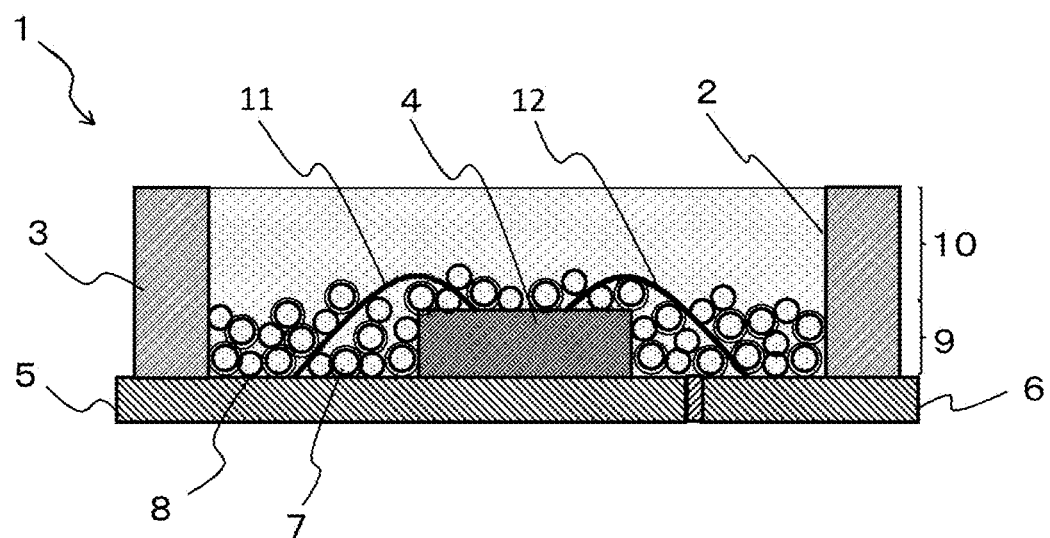
FIG. 1 is a schematic cross-sectional view showing an example of light emitting device according to an embodiment.

Fluoride fluorescent materials activated with $Mn^{4+}$ which can emit red light with a narrow half width of the emission peak are assumed to be suitable for the use in display devices, and practical use of such fluoride fluorescent materials has been in demand. However, it is considered that in such conventional fluoride fluorescent materials activated with $Mn^{4+}$, tetravalent manganese ions which are constituent components of the fluoride fluorescent materials and present on the fluorescent material particles may react with atmospheric moisture to generate manganese dioxide which darkens the surfaces of the particles, resulting in deviation in the chromaticity and reduction in the optical output over time. For this reason, the conventional fluoride fluorescent materials activated with $Mn^{4+}$ may be difficult to apply for the backlight of liquid crystal display devices, which emphasizes the reliability.

Accordingly, an aim of the present disclosure is to provide a light emitting device in which reduction in the optical output and occurrence of deviation in chromaticity can be suppressed, and to provide a method of manufacturing the light emitting device.

Specific examples for achieving the objects will be described below. The present disclosure includes embodiments as described below. A light emitting device according to a first aspect of the disclosure includes a package having side walls which define a recess, a light emitting element arranged in the recess, and a sealing member configured to seal the light emitting element. The sealing member includes a first portion which contains particles of a fluorescent material and covers the light emitting element, and a second portion which does not contain particles of the fluorescent material and is arranged over the first portion. The fluorescent material includes a fluoride fluorescent material activated with tetravalent manganese ion which has a chemical composition represented by the following formula (I) and the particles of the fluoride fluorescent material have a surface region where a tetravalent manganese ion concentration is lower than that in an inner region.

$$A_2[M_{1-b}Mn^{4+}_bF_6] \quad (I)$$

In the formula (I), A is a cation which contains at least $K^+$ and may further contain at least one selected from the group consisting of $Li^+$, $Na^+$, $Rb^+$, $Cs^+$, and $NH_4+$, M is at least one selected from the group consisting of Group 4 elements and Group 14 elements, and $0<b<0.2$.

A method of manufacturing a light emitting device according to a second aspect of the disclosure includes providing a package having side walls which define a recess, arranging a light emitting element in the recess, injecting a sealing material in the recess of the package, the sealing material including particles of a fluoride fluorescent material and a binder, the fluoride fluorescent material having a chemical composition represented by the following formula (I) and the particles of the fluoride fluorescent material having a surface region which has a tetravalent manganese ion concentration lower than a tetravalent manganese ion concentration in an inner region of the particles of the fluorescent material; disposing a sealing member which includes a first portion and a second portion by centrifugally sedimenting the particles of the fluorescent material toward a bottom surface in the recess to form the first portion which contains the particles of the fluorescent material and covers the light emitting element and the second portion which substantially does not contain the particles of the fluorescent material and is located above the first portion; and forming the sealing member by curing the sealing material.

$$A_2[M_{1-b}Mn^{4+}_bF_6] \quad (I)$$

In the formula (I), A is a cation which contains at least $K^+$ and may further contain at least one selected from the group consisting of $Li^+$, $Na^+$, $Rb^+$, $Cs^+$, and $NH_4^+$, M is at least one selected from the group consisting of Group 4 elements and Group 14 elements, and $0<b<0.2$.

Accordingly, a light emitting device in which reduction in the optical output and occurrence of deviation in chromaticity can be suppressed, and a method of manufacturing the light emitting device can be provided.

A light emitting device and a method of manufacturing the light emitting device according to the present disclosure will be described below by way of the embodiments and Examples. The embodiments are intended as illustrative of a light emitting device and a method of manufacturing the light emitting device to give a concrete form to technical ideas of the present invention, and the scope of the invention is not limited to those described below. In the specification, the relation between the color names and the chromaticity coordinates, the relation between the range of wavelength of light and the color name of single color light, and the like conform to JIS Z8110. More specifically, the wavelengths of 380 nm to 410 nm correspond to purple light, 410 nm to 455 nm corre-spond to blue purple light, 455 nm to 485 nm correspond to blue light, 485 nm to 495 nm correspond to blue green light, 495 nm to 548 nm correspond to green light, 548 nm to 573 nm correspond to yellow green light, 573 nm to 584 nm correspond to yellow light, 584 nm to 610 nm correspond to yellow red light, and 610 nm to 780 nm correspond to red light.

In the specification, the term "step" refers not only an independent step but also a step which is indistinguishable from other step but which can achieve an intended purpose. Also, a numerical range indicated using "to" in the present specification represents a range including numerical values described before and after "to" as a minimum value and a maximum value, respectively. Further, the "content of each component in the sealing material" indicates that in the case where a plural number of substances corresponding to each component are present in the sealing material, refers to a total amount of the plural number of substance in the sealing material, unless otherwise stated.

Light Emitting Device

FIG. 1 is a diagram illustrating a light emitting device according to a first embodiment. With referring to FIG. 1, the light emitting device 1 according to the first embodiment will be described. A light emitting device 1 includes a package 3 having side walls which define a recess 2; a light emitting element 4 arranged on a bottom of the recess 2; and sealing members 9, 10 which seals the light emitting element 4. The sealing members 9, 10 respectively include a first portion 9 which contains fluorescent material particles 7, 8 and covers the light emitting element 4, and a second portion 10 which does not contain the fluorescent materials 7, 8 and is arranged over the first portion 9. The fluorescent material particles 7 contains particles of a fluoride fluorescent material activated with tetravalent manganese and has a chemical composition represented by the following formula (I), and the fluorescent material particles 7 have a surface region in which a tetravalent manganese ion concentration is lower than a tetravalent manganese ion concentration of an inner side of the fluorescent material particles 7. The fluorescent material particles 8 are particles of a fluorescent material other than the fluoride fluorescent material described above, hereinafter the fluorescent material particles may be referred to "other fluorescent material particles".

$$A_2[M_{1-b}Mn^{4+}_bF_6] \quad (I)$$

In the formula (I), A is a cation which contains at least $K^+$ and may further contain at least one selected from the group consisting of $Li^+$, $Na^+$, $Rb^+$, $Cs^+$, and $NH_4^+$, M is at least one selected from the group consisting of Group 4 elements and Group 14 elements, and $0<b<0.2$.

As shown in FIG. 1, the light emitting device 1 includes a package 3 having side walls which define a recess 2, a light emitting element 4 arranged in the recess 2, and a first portion 9 which contains particles of a fluoride fluorescent material 7, and other fluorescent material particles 8 and covers the light emitting element 4, and a second portion 10 which substantially does not contain the fluorescent material particles and is arranged over the first portion 9. As described below, the first portion 9 and the second portion 10 can be formed by curing the sealing material which contains at least a binder and a fluorescent material.

The light emitting element 4 is arranged on a first lead 5 disposed on the bottom of the recess 2 of the package 3. With its positive and negative electrodes, the light emitting element 4 is connected to a first lead 5 and a second lead 6 which are made of a metal and are fixed to the package 3 via wires 11, 12, respectively. The first lead 5 and the second lead 6 constitute the bottom surface of the recess 2 of the package 3.

As shown in FIG. 1, the first portion 9 and the second portion 10 may be in a state in which a same binder which also serves as a sealing member is contained and an interface between the first portion 9 and the second portion 10 can be clearly distinguished, but is not limited thereto.

Package

The material of the package having side walls which define a recess is not specifically limited and an electrically insulating material having good light resistance and heat resistance can be suitably used. For example, the package can be formed with a material such as a resin, a ceramics, or the like. Examples of the resin used for the material of the package include, a thermoplastic resin such as a polyphthalamide resin, a thermosetting resin such as an epoxy resin, and a glass epoxy resin.

Light Emitting Element

A light emitting element which can emit a light of a short-wavelength region of visible light can be used. For example, a light emitting element for emitting light of a blue color or a green color, a nitride-based semiconductor ($In_XAl_YGa_{1-X-Y}N$, $0 \leq X$, $0 \leq Y$, $X+Y \leq 1$) etc., can be used. As a light source, hereinafter may be referred to as an "excitation light source", a light emitting element which can emit light whose emission peak wavelength being in a range of 380 nm to 485 nm, of a short-wavelength region of visible light, can be preferably used. A light source preferably has an emission peak wavelength (maximum emission wavelength) in a wavelength range of 420 nm to 485 nm, more preferably in a wavelength range of 440 nm to 480 nm. With this configuration, the fluorescent material can be efficiently excited, so that the visible light can be effectively used. Also, with the use of a light source of the wavelength range as described above, a light emitting device with high emission intensity can be obtained. With the use of a semiconductor light emitting element as an excitation light source, a light emitting device which has high linearity of outputting to inputting in high efficiency and exhibits high stability to mechanical impacts can be obtained.

First Lead and Second Lead

The first lead 5 and the second lead 6 are arranged at the bottom of the recess 2 of the package 3, and the first lead 5 and the second lead 6 constitute the bottom surface of the recess 2 of the package 3. The first lead and the second lead may be referred to collectively as "electrically conductive members" and individually as an "electrically conductive member". Each of the first lead 5 and the second lead 6 may be made singly of an electrically conductive base material, or may be made of a base member and includes a reflecting layer. Each of the first lead 5 and the second lead 6 may be made singly of an electrically conductive reflecting layer. Each of the first lead 5 and the second lead 6 may be made of an electrically conductive base material and a reflecting layer, with one or more other members being interposed therebetween. In the case where the electrically conductive member includes a base material and a reflecting layer, the reflecting layer is arranged at a side where a light emitting element 4 to be mounted.

Base Material of First Lead and Second Lead

In the case where the base material of the first lead and the second lead have electrically conducting property, for example, copper or a copper alloy may be used. Examples of other materials suitable for the base material of the first lead and the second lead include a ceramic material, an epoxy resin, a polyimide resin. The first lead and the second lead are approximately plate-like members which can mount a light emitting element 4 and constitute the bottom surface of the recess 2 of the package 3. Alumina, aluminum nitride, mullite, silicon carbide, silicon nitride, or the like can be used as the ceramic material. Also, a base material may be a calcined stacked-layer of ceramic green sheets, which are obtained by mixing ceramic powder and a resin, forming the mixture into a sheet shape, processing the green sheet into individual green sheets, and stacking the individual green sheets and calcining the stacked ceramics green sheet. A base material which employs an epoxy resin may be obtained by, for example, attaching a copper plate on a prepreg which is obtained by impregnating an epoxy resin into a glass cloth and semi-cured it, or on a semi-cured epoxy-resin, then applying heat to effect thermosetting.

Reflecting Layer of First Lead and Second Lead

For the reflecting layer, for example, a material which contains silver or aluminum can be used, and particularly, a material which contains silver which has a high reflectance is preferably used. Examples of such materials include metals such as copper, aluminum, gold, silver, tungsten, iron, nickel, iron-nickel alloy, phosphor bronze, iron copper, or the like.

Insulating Member

The light emitting element 4, the first lead 5, the second lead 6, and the wires 11, 12 are preferably covered with an insulating member. The insulating member is preferably disposed continuously on the light emitting element 4, the first lead 5, the second lead 6, and the wires 11, 12. In the specification, the expression "disposed continuously" includes a state of the insulating member being disposed in the form of a layer (or film) on the object which is made up of the light emitting element 4, the first lead 5, the second lead 6, and the wires 11, 12, or a state in which, while leaving partially uncovered spots, power-shape or needle-shaped insulating member is applied on approximately whole of the light emitting element 4, the first lead 5, the second lead 6, and the wires 11, 12. The insulating member can block the gas, moisture, and fluorine (F) contained in the fluorescent material which may deteriorate the metals which constitute the light emitting element 4, the first lead 5, the second lead 6, and the wires 11, 12, in particular, silver which constitutes the first lead 5 and the second lead 6. The fluorine contained in the fluorescent material and the silver contained in the electrically conductive members or the like may react to generate silver fluoride having a dark color, which may absorb light emitted from the light emitting element, resulting in a reduction of optical output. Deterioration of silver contained in the first lead 5, the second lead 6, or the like can be efficiently suppressed by the insulating member, so that the light output efficiency can be improved. The insulating member can serve as a passivation layer which can block gases such as sulfur (S) and oxygen (O), moisture, and fluorine (F) etc., contained in the fluorescent material, so that migration of silver contained in the first lead 5, the second lead 6, etc., can be suppressed.

Material of the insulating member preferably has light-transmissive property, and an inorganic material is preferably employed. Examples of the material for the insulating member include oxides such as $SiO_2$, $Al_2O_3$, $TiO_2$, $ZrO_2$, $ZnO_2$, $Nb_2O_3$, $MgO$, $SrO$, $In_2O_3$, $TaO_2$, $HfO$, $SeO$, $Y_2O_3$, nitrides such as SiN, AlN, AlON, fluorides such as $MgF_2$. Those materials may be used singly or in combination of two or more kinds. Alternatively, two or more layers of insulating members which contain one or two or more materials may be stacked.

The insulating member preferably has a thickness which does not allow optical loss due to multiple reflection at each of the interfaces between the electrically conductive member, the insulating member, the first portion 9, the second portion 10, or the like. Meanwhile, the insulating member is required to have a thickness sufficient for blocking a gas and moisture, and fluorine (F) or the like contained in the fluorescent material so as to prevent a reaction between the electrically conductive member and a gas and moisture, and fluorine (F) or the like contained in the fluorescent material. The thickness of the insulating member may be varied slightly according to the material or the like of each member which constitutes the light emitting device. The insulating member preferably has a thickness of about 1 nm to about 100 nm. The insulating member more preferably has a thickness of 1 nm to 50 nm, further preferably 2 nm to 25 nm, and particularly preferably 3 nm to 10 nm.

It is preferable that the insulating member is made of an inorganic compound disposed in a form of a film (e.g. a layer) disposed on the electrically conductive member, the wires 11, 12, and the light emitting element 4, by using sputtering, vapor deposition, or the like. It is more preferable that the insulating member is formed by using atomic layer deposition method. Atomic layer deposition method is a method for forming layers of a reactive component one atomic layer at a time. Different from an conventional method such as sputtering or vapor deposition, in an atomic layer deposition method, a reactive component can be uniformly supplied on the target even in the presence of an obstacle, so that a high quality protective layer with uniform thickness and uniform composition can be formed. The insulating member (e.g. a film) formed by using atomic layer deposition method has a small thickness, so that absorption of light by the insulating member can be reduced, and thus a light emitting device with can exhibit high optical output in its initial characteristics can be provided.

Next, an example of forming an insulating member (e.g. a film) of aluminum oxide ($Al_2O_3$) by using atomic layer deposition method will be described. First, trimethylaluminium, hereinafter may be referred to as "TMA", gas is introduces to the surface of the target materials of the electrically conductive member, the wires 11, 12, and the light emitting element 4 so that the OH groups in the electrically conductive member, the wires 11, 12, and the light emitting element 4 are allowed to react with the TMS gas (first reaction). Next, excess gas is evacuated. Then, $H_2O$ gas is introduced to the target materials so that the TMA reacted with the OH groups in the first reaction is allowed to react with the $H_2O$ (second reaction). Next, excess gas is evacuated. The first reaction, evacuation, the second reaction, and evacuation are taken as one cycle and the cycle is repeated a plurality of times. Thus, a film of aluminum oxide ($Al_2O_3$) of a desired thickness is formed on the electrically conductive member, the wires 11, 12, and the light emitting element 4.

First Portion and Second Portion

A first portion 9 and a second portion 10 constitute a sealing member for sealing the light emitting element 4. The first portion 9 and the second portion 10 can be formed by using a sealing material which contains at least a binder and a fluorescent material. The sealing material is injected in the recess 2 of the package 3 where the light emitting element has been arranged 4. The fluoride fluorescent material particles 7 and other fluorescent material particles 8 contained in the sealing material are centrifugally sedimented to the light emitting element 4 side, then, the binder is cured. Thus, the first portion 9 which covers the light emitting element 4 and contains the fluoride fluorescent material particles 7 and other fluorescent material particles 8 and the second portion 10 which substantially does not contain the fluoride fluorescent material particles 7 and other fluorescent material particles 8 are formed.

The first portion 9 contains the fluoride fluorescent material particles which have a chemical composition represented by the formula (I), and the particles have a surface region which has tetravalent manganese ion concentration lower than the tetravalent manganese ion concentration in an inner region. In the sealing material which contains at least a binder and a fluorescent material including the fluoride fluorescent material particles, the fluoride fluorescent material particles are sufficiently dispersed so that by centrifugal separation, the fluorescent material particles are sedimented on the light emitting element without over packing and the sealing material is layer-separated to obtain the first portion 9 and the second portion 10 before curing.

The first portion 9 and the second portion 10 contain a common binder which allows for suppression of deterioration in the optical output of the light emitting element and chromaticity deviation. The light emitting element 4 is covered with the fluorescent material particles 7 and other fluorescent material particles 8, so that the wavelength of the light emitted from the light emitting element can be efficiently converted by the fluorescent materials and the light can be efficiently emitted.

However, it is considered that in such a conventional fluoride fluorescent materials activated with $Mn^{4+}$, tetravalent manganese ions which are constituent components of the fluoride fluorescent material and present on the fluorescent material particles may react with moisture in the air to generate manganese dioxide which darkens the surfaces of the particles, resulting in occurrence of deviation in the chromaticity and reduction in the optical output. On the other hand, in the light emitting device according to an embodiment, entering of the atmospheric moisture from the interface between the light emitting surface created by the second portion 10 and the package 3 can be blocked by the second portion 10. Blocked by the second portion 10, the moisture in the air hardly reach the fluorescent material particles 7 and other fluorescent material particles 8 contained in the first portion 9, so that reaction between the moisture and the tetravalent manganese ions contained in the fluoride fluorescent material activated with $Mn^{4+}$ in the first portion 9 can be prevented, and thus generation of manganese dioxide which darkens the surfaces of the particles can be prevented. Accordingly, deterioration in the optical output and deviation in the chromaticity can be suppressed in the light emitting device according to the present embodiment and sufficient durability can be achieved in a long-term reliability test. Moreover, in the light emitting device according to the present embodiment, by the second portion 10, the moisture in the air can be blocked from reaching the fluoride fluorescent material contained in the first portion 9, so that deterioration of the fluoride fluorescent material can be suppressed. When the fluoride fluorescent material deteriorates, $Mn^{4+}$, $F^-$, or the like contained in the fluoride fluorescent material may be eluted, resulting in a deterioration of the binder which constitutes the first portion 9 and the second portion 10. But according to the present embodiment, deterioration of the fluoride fluorescent material can be prevented, and which further allows to prevent deterioration of the first portion 9 and the second portion 10.

The second portion preferably has a thickness of one tenth or greater with respect to the entire thickness of the sealing member, at directly above the light emitting element. With the thickness of the second portion directly above the light emitting element one tenth or greater with respect to the entire thickness of the sealing member, the converted light by the fluorescent material can be efficiently released to the outside of the light emitting device.

The second portion preferably has a thickness of one fourth or greater with respect to the entire thickness of the sealing member, at directly above the light emitting element. With the thickness of the second portion directly above the light emitting element one fourth or greater with respect to the entire thickness of the sealing member, the moisture in the air can be blocked by the second portion 10, so that the moisture hardly reach the fluorescent materials contained in the first portion, so that reaction between the moisture and the tetravalent manganese ions contained in the fluoride fluorescent material activated with $Mn^{4+}$ in the first portion 9 can be prevented, and thus generation of manganese dioxide which darkens the surfaces of the particles can be prevented.

Sealing Material

The sealing member including the first portion and the second portion can be formed with a sealing material which contains at least a binder and a fluorescent material and which becomes the sealing member upon being cured. The sealing material which constitutes the sealing member through curing may further contain a filler material which has a volume average particle size of 1 μm to 20 μm. The sealing material may further contain a nano-filler material which has a primary particle with an average particle size of 5 nm to 20 nm.

Binder

The binder contained in the sealing material which constituted the sealing member preferably has light transmissive property allowing light from the light emitting element to pass through. Examples of the binder include a glass and a resin. The binder is preferably a resin. Specific examples of the resin include a silicone resin, a modified silicone resin, an epoxy resin, a modified epoxy resin, and an acrylic resin. The resin is preferably at least one selected from the group consisting of a silicone resin, a modified silicone resin, an epoxy resin, a modified epoxy resin, and an acrylic resin. The resin may be a silicone resin, an epoxy resin, a urea resin, a fluororesin or a combination thereof. Among those, a modified silicone resin is preferably used, and a phenyl silicone resin in which a phenyl group is introduced in a part of the polysiloxane side chains is preferable.

In the case where the binder in the sealing material is made of a resin, the content of the resin in the sealing material is preferably 5 to 95 mass % with respect to 100 mass % of the sealing material. The content of the resin in the sealing material with respect to 100 mass % of the sealing material is more preferably 35 to 85 mass %, further preferably 40 to 80 mass %, and particularly preferably 45 to 75 mass %. In the case where the binder in the sealing material is made of a resin, with the content of the resin of 5 to 95 mass % with respect to 100 mass % of the sealing material, the members such as a light emitting element arranged in the recess can be stably protected by the sealing member which is formed by curing the sealing material. In addition, with the content of the resin in the sealing material in the range as described above, a sufficient amount of the fluorescent material to cover the light emitting element can be contained in the first portion.

Fluoride Fluorescent Material

The fluorescent material contains particles of a fluoride fluorescent material which is activated with tetravalent manganese ion and has a chemical composition represented by the formula (I) and the particles have a surface region in which a tetravalent manganese ion concentration is lower than the tetravalent manganese ion concentration in the inner region.

$$A_2[M_{1-b}Mn^{4+}{}_bF_6] \quad \text{(I)}$$

In the formula (I), A is a cation which contains at least $K^+$ and may further contain at least one selected from the group consisting of $Li^+$, $Na^+$, $Rb^+$, $Cs^+$, and $NH_4^+$, M is at least one selected from the group consisting of Group 4 elements and Group 14 elements, and 0<b<0.2.

The fluoride fluorescent material which has a chemical composition represented by the formula (I) and the particles thereof have a surface region in which a tetravalent manganese ion concentration is lower than the tetravalent manganese ion concentration in the inner region is a red light-emitting fluorescent material with a narrow half value width of the emission spectrum and has excellent water resistance and the light emitting device according to an embodiment can exhibit satisfactory durability in a long-term reliability test. This can be considered as below, for example. However, it is considered that in such conventional fluoride fluorescent materials activated with $Mn^{4+}$, tetravalent manganese ions which are constituent components of the fluoride fluorescent materials and present on the fluorescent material particles may react with moisture in the air to generate manganese dioxide which darkens the surfaces of the particles, resulting in occurrence of deviation in the chromaticity and reduction in the optical output over time. Accordingly, satisfactory durability cannot be obtained in a long-term reliability test, so that the usage which requires reliability, for example, in-vehicle applications, has been regarded difficult to implement. However, in the fluoride fluorescent materials according to an embodiment of the present invention, the tetravalent manganese ion concentration in the surface regions of the fluoride particles is kept lower than the concentration in the inner regions. Accordingly, it is considered that generation of manganese dioxide on the surfaces of the particles can be suppressed and deterioration in the optical output and deviation in the chromaticity can be suppressed for a long period. It is considered that, thus, good long-term reliability can be achieved.

The particle diameter and the particle size distribution of the fluoride fluorescent material which has a chemical composition represented by the formula (I) are not specifically limited, but in view of the emission intensity and durability, a particle size distribution with a single peak is preferable and a narrow particle size distribution with a single peak is more preferable. The surface area and the bulk density of the fluoride fluorescent material are not specifically limited.

The fluoride fluorescent materials are fluorescent materials activated with $Mn^{4+}$ which can absorb light in a short-wavelength region and emit light of red color. The excitation light which is a visible light in a short wavelength region is preferably light in blue color region. More specifically, the excitation light preferably has a main peak wavelength in an intensity spectrum in a range of 380 nm to 500 nm, more preferably in a range of 380 nm to 485 nm, further preferably in a range of 400 nm to 485 nm, and particularly preferably in a range of 440 nm to 480 nm.

The emission wavelengths of the fluoride fluorescent materials are not specifically limited as long as the emission wavelength is longer than the wavelength of its excitation light and in red color region. The emission spectrum of the fluoride fluorescent material preferably has a peak wavelength in a range of 610 nm to 650 nm. The smaller half value width of the emission spectrum is more preferable, and more specifically, 10 nm or less is preferable.

In the formula (I), A is at least potassium ion ($K^+$) and may further include at least one selected from the group consisting of lithium ion ($Li^+$), sodium ion ($Na^+$), rubidium ion ($Rb^+$), cesium ion ($Cs^+$), and ammonium ion ($NH_4^+$). The content of potassium in A is not specifically limited, and for example, preferably 50 mole % or greater and more preferably 80 mole % or greater.

In the formula (I), M is at least one selected from the group consisting of Group 4 elements and Group 14 elements. In view of luminous characteristics, M is preferably at least one selected from the group consisting of titanium (Ti), zirconium (Zr), hafnium (Hf), silicon (Si), germanium (Ge), and tin (Sn). More preferably, M includes silicone (Si) or silicone (Si) and germanium (Ge), and further preferably, M is silicone (Si) or silicone (Si) and germanium (Ge). In the case of M includes silicon (Si) or silicon (Si) and germanium (Ge), a portion of at least one of Si and Ge may be substituted with at least one selected from the group consisting of Group 4 elements including Ti, Zr, and Hf, and Group 14 elements including C and Sn. In such a case, the total content of Si and Ge in M is not specifically limited and for example, 50 mole % or greater is preferable and 80 mole % or greater is further preferable.

The fluoride fluorescent material particles include an inner region which is formed in a first step to be described in detail below and a surface region which is formed in a second step, a third step or a variant of the second step in which the concentration of tetravalent manganese ion is lower than that in the inner region.

In the surface region of the fluoride fluorescent material particles, the concentration of tetravalent manganese ion is lower than that in the inner region. The surface region may be demarcated from the inner region by a clear interface such as a two-layer structure, or the surface region is not demarcated from the inner region by a clear interface and the concentration of tetravalent manganese ion gradually decreases from the inner side of the surface region toward the outer side. The particles of the fluoride fluorescent material obtained by using a method of manufacturing which is to be described below have a surface region which do not have or have little amount of tetravalent manganese ions derived from tetravalent manganese ions, even when the surfaces of the fluoride fluorescent materials are eluded due to the humidity, so that generation of manganese dioxide derived from tetravalent manganese ions can be suppressed while maintaining property which allows wide color reproduction range in the image display device, compared to a light emitting device which employs a conventional fluoride fluorescent material whose entire particles are activated with tetravalent manganese ions. Accordingly, blackening of the surfaces of the fluoride fluorescent material particles can be suppressed and deterioration in the emission intensity can be reduced.

The average concentration of tetravalent manganese ions in the surface region of the fluoride fluorescent material particles is preferably 30 mass % or less with respect to the average concentration of tetravalent manganese ions in the inner region. Further, the concentration of tetravalent manganese ions in the surface region is preferably 25 mass % or less, more preferably 20 mass % or less, with respect to the concentration of tetravalent manganese ions in the inner region. Meanwhile, the concentration of tetravalent manganese ions in the surface region can be 0.5 mass % or more with respect to that of the inner region. As described above, with the concentration of tetravalent manganese ions being made approximately zero, humidity resistivity increases, but as the concentration of tetravalent manganese ion in the surface regions decreases, the ratio of the regions which do not contribute to emission increases in the surface regions of fluoride fluorescent material particles, resulting in a tendency of decrease in emission intensity.

Although depending on the particle diameter of the fluoride fluorescent material, the thickness of the surface region is preferably about 1/10 to about 1/50 with respect to the average particle diameter. For example, in the case where the fluoride material particles have an average particle diameter of 20 to 40 μm, the thickness of the surface region may be 2 μm or less.

The fluoride fluorescent material can be prepared so that an elution amount of tetravalent manganese ion in pure water which is one to five times greater in mass than the mass of the fluoride fluorescent materials is, for example, in a range of 0.05 ppm to 3 ppm at 25° C. The elution amount of tetravalent manganese ion under a condition described above is preferably in a range of 0.1 to 2.5 ppm and more preferably in a range of 0.2 to 2.0 ppm. This is because, although the lower the elution amount of tetravalent manganese ion the higher the water resistance will be, the greater the ratio of surface area with a low concentration of tetravalent manganese ion will result in a degradation of emission intensity as described above. The elution amount of manganese ion can be measured by using a quantitative analysis through ICP emission analysis, in which the fluoride fluorescent materials are placed in pure water which is one to five times, preferably three times, greater in mass than the mass of the fluoride fluorescent materials and agitated at 25° C. for 1 hour. Then, a reducing agent is added to elude manganese ion into the solution, and a supernatant is collected to measure by a quantitative analysis through ICP emission analysis.

With the fluoride fluorescent materials of the configuration as described above, reduction in the optical output and deviation in the chromaticity accompanied with discoloration due to generation of manganese dioxide caused by tetravalent manganese ion resulting from the fluoride fluorescent materials contacting water, can be suppressed, so that the fluoride fluorescent materials with high moisture-resistance can be realized.

The moisture-resistance of the fluoride fluorescent materials can be confirmed by discoloration through a pressure cooker test (PCT). Otherwise, the moisture-resistance can be evaluated by, for example, an emission luminance maintenance rate of after a water-resistance test, which is a rate (%) of the emission luminance after the water-resistance test with respect to the emission luminance before the water-resistance test. The emission luminance maintenance rate after the water-resistance test is preferably 85% or more, and more preferably 90% or more. More specifically, in the present specification, the water-resistance test is performed by placing fluoride fluorescent materials in water of one to five times, preferably three times, in mass of the fluoride fluorescent material sand agitate it at 25° C. for 1 hour.

Method of Manufacturing Fluoride Fluorescent Material

A method of manufacturing a fluoride fluorescent material which has a chemical composition represented by the formula (I) and has a surface region in which a tetravalent manganese ion concentration is lower than a tetravalent manganese ion concentration in an inner region, the method includes a first step of forming an inner region, hereinafter may be referred to as a "core portion", a second step and a third step of forming a surface region.

First Step

A method of manufacturing a fluoride fluorescent material may further include providing a fluoride which has a chemical composition represented by the formula (I). The step of providing can include steps of manufacturing a fluoride fluorescent material which has a chemical composition represented by the formula (I). The fluoride fluorescent material having a chemical composition represented by the formula (I) can be manufactured such that in a solvent which contains hydrogen fluoride, first complex ions which include tetravalent manganese ions, cations which at least include potassium ions ($K^+$), and may further include at least one selected from the group consisting of lithium ions ($Li^+$), sodium ions ($Na^+$), rubidium ions ($Rb^+$), cesium ions ($Cs^+$), and ammonium ions ($NH_4^+$), and second complex ions which include at least one selected from a group consisting of Group 4 elements and Group 14 elements are brought in contact with each other.

The fluoride fluorescent material having a chemical composition represented by the formula (I) can be manufactured by, for example, a method which includes a step of mixing a solution a which at least contains a first complex ion which includes tetravalent manganese ions, a second complex ion which includes at least one selected from the group consisting of Group 4 elements and Group 14 elements, and fluorine ion, and a solution b which at least contains $K^+$, and may further contain at least one selected from the group consisting of $Li^+$, $Na^+$, $Rb^+$, $Cs^+$, and $NH_4^+$. Hereinafter, the step may be called as a "first step of manufacturing fluoride fluorescent material".

Solution a

The solution a is a solution of a hydrofluoric acid which contains a first complex ion which includes tetravalent manganese ions, and a second complex ion which includes at least one selected from Group 4 elements and Group 14 elements in addition to fluorine ions.

The manganese source for producing the first complex ion which includes tetravalent manganese ion is not specifically limited as ion as it is a chemical compound which contains manganese. Specific examples of the manganese source which can constitute the solution a include $K_2MnF_6$, $KMnO_4$, and $K_2MnCl_6$. Among those, $K_2MnF_6$ is preferable, because it can be present stably as a $MnF_6$ complex ion in hydrofluoric acid while maintaining the oxidation number (tetravalent) necessary for activating. Among the manganese sources, a manganese source which at least contains potassium ion ($K^+$) and may further include at least one cation selected from the group consisting of lithium ion ($Li^+$), sodium ion ($Na^+$), rubidium ion ($Rb^+$), cesium ion ($Cs^+$), and ammonium ion ($NH_4^+$) can also serve as a cation source in the solution b. Those manganese sources for producing the first complex ion may be used singly or in combination of two or more kinds.

The concentration of the first complex ion in the solution a is not specifically limited. The lower-limit value of the first complex ion concentration in the solution a is generally 0.01 mass % or greater, preferably 0.03 mass % or greater, and more preferably 0.05 mass % or greater. The upper-limit value of the first complex ion concentration in the solution a is generally 50 mass % or less, preferably 40 mass % or less, and more preferably 30 mass % or less.

The second complex ion preferably includes at least one selected from the group consisting of titanium (Ti), zirconium (Zr), hafnium (Hf), silicon (Si), germanium (Ge), and tin (Sn), more preferably includes silicon (Si) or silicon (Si) and germanium (Ge), and further preferably, the second complex ion is a silicon fluoride complex ion. For example, in the case of the second complex ion includes silicon (Si), the second complex ion source is preferably a chemical compound which contains silicon and fluorine and has high solubility in the solution. Specific examples of the second complex ion source include $H_2SiF_6$, $Na_2SiF_6$, $(NH_4)_2SiF_6$, $Rb_2SiF_6$, and $Cs_2SiF_6$. Among those, $H_2SiF_6$ is preferable because of its high water-solubility and it's free from impurities of alkaline metal elements. The second complex ion sources may be used singly or in combination of two or more kinds.

The lower-limit value of the second complex ion concentration in the solution a is generally 5 mass % or greater, preferably 10 mass % or greater, and more preferably 15 mass % or greater. The upper-limit value of the second complex ion concentration in the solution a is generally 80 mass % or less, preferably 70 mass % or less, and more preferably 60 mass % or less.

The lower-limit value of hydrogen fluoride concentration in the solution a is generally 20 mass % or greater, preferably 25 mass % or greater, and more preferably 30 mass % or greater. The upper-limit value of hydrogen fluoride concentration in the solution a is generally 80 mass % or less, preferably 75 mass % or less, more preferably 70 mass % or less.

Solution b

The solution b at least includes hydrogen fluoride and cation which at least include potassium ion ($K^+$) and may further include at least one selected from the group consisting of lithium ion ($Li^+$), sodium ion ($Na^+$), rubidium ion ($Rb^+$), cesium ion ($Cs^+$), and ammonium ion ($NH_4^+$), and may further includes other components as necessary. The solution b is provided as an aqueous solution of hydrofluoric acid which contains cation which at least include potassium ion ($K^+$) and may further include at least one selected from the group consisting of lithium ion ($Li^+$), sodium ion ($Na^+$), rubidium ion ($Rb^+$), cesium ion ($Cs^+$), and ammonium ion ($NH_4^+$), and may further includes other components as necessary. Specific examples of potassium ion source which can constitute the solution b include water-soluble potassium salts such as KF, $KHF_2$, KOH, KCl, KBr, KI, potassium acetate, and $K_2CO_3$. Among those, $KHF_2$ is preferable, because $KHF_2$ is soluble without decreasing the concentration of hydrogen fluoride in the solution, and has a small heat of dissolution which contributes high safety. Specific examples of the sodium ion source which can constitute the solution b include water soluble salts such as NaF, $NaHF_2$, NaOH, NaCl, NaBr, NaI, sodium acetate, and $Na_2CO_3$. Specific examples of rubidium ion source which can constitute the solution b include water-soluble rubidium salts such as RbF, rubidium acetate, and $Rb_2CO_3$. Specific examples of cecium ion source which can constitute the solution b include water-soluble cecium salts such as CsF, cecium acetate, and $Cs_2CO_3$. Specific examples of the ammonium ion source which can constitute the solution b include water soluble ammonium salts such as $NH_4F$, ammonia water, $NH_4Cl$, $NH_4Br$, $NH_4I$, ammonium acetate, and $(NH_4)_2CO_3F_2$. Those $SiF_6$ sources may be used singly or in combination of two or more kinds.

The lower-limit value of hydrogen fluoride concentration in the solution b is generally 20 mass % or greater, preferably 25 mass % or greater, and more preferably 30 mass % or greater. The upper-limit value of hydrogen fluoride concentration in the solution b is generally 80 mass % or less, preferably 75 mass % or less, more preferably 70 mass % or less. The lower-limit value of hydrogen fluoride concentration in the solution b is generally 5 mass % or greater, preferably 10 mass % or greater, and more preferably 15 mass % or greater. The upper-limit value of cation concentration in the solution b which at least contains potassium ion ($K^+$) and may further include at least one selected from the group consisting of lithium ion ($Li^+$), sodium ion ($Na^+$), rubidium ion ($Rb^+$), cesium ion ($Cs^+$), and ammonium ion ($NH_4^+$) is generally 80 mass % or less, preferably 70 mass % or less, more preferably 60 mass % or less.

The mixing method of the solution a and b is not specifically limited, and the mixing may be performed by adding the solution a into the solution b while agitating the solution b, or by adding the solution b into the solution a while agitating the solution a. The solution a and the solution b may be respectively placed in a container and agitated. The first complex ion, the cation which include at least potassium ion ($K^+$) and may further include at least one selected from the group consisting of lithium ion ($Li^+$), sodium ion ($Na^+$), rubidium ion ($Rb^+$), cesium ion ($Cs^+$), and ammonium ion ($NH_4^+$), and the second complex ions are reacted in a predetermined ratio by mixing the solution a and the solution b, to precipitate the crystals of the objective fluoride. The precipitated crystal can be collected by solid-liquid separation, e.g., filtration. The collected crystal may be washed with a solvent such as ethanol, isopropyl alcohol, water, or acetone. Further, drying treatment may be performed at a temperature generally 50° C. or greater, preferably 55° C. or greater, more preferably 60° C. or greater, and generally 110° C. or less, preferably 100° C. or less, and more preferably 90° C. or less. The drying time is not specifically limited as long as the water or moisture present on the fluoride fluorescent material can be evaporated, and for example, drying may be performed for about 10 hours. At the time of mixing of the solution a and the solution b, considering a difference between the charge composition of the solution a and the solution b and the composition of the fluorescent material product, the mixing ratio of the solution a and the solution b is appropriately adjusted so that the fluoride fluorescent material product has a desired composition.

The fluoride fluorescent material which has a chemical composition represented by the formula (I) can be manufactured by, for example, a method which includes a step of mixing a first solution which at least contains a first complex ion which includes tetravalent manganese ions and hydrogen fluoride, a second solution which at least contains cations which at least contain potassium ions ($K^+$) and may further contains at least one selected from the group consisting of lithium ions ($Li^+$), sodium ions ($Na^+$), rubidium ions ($Rb^+$), cesium ions ($Cs^+$), and ammonium ions ($NH_4^+$), and hydrogen fluoride, and a third solution which at least contains second complex ion which contains at least one selected from the group consisting of Group 4 elements and Group 14 elements and fluorine ion. Hereinafter, the step may be called as a "second step of manufacturing fluoride fluorescent material". By mixing the first solution, the second solution, and the third solution, a fluoride fluorescent material which has a desired composition and a desired weight median diameter can be manufactured easily and with good productivity.

First Solution

The first solution contains at least first complex ion which includes tetravalent manganese ions and hydrogen fluoride, and may contains other components as necessary. The first solution is prepared, for example, as an aqueous solution of hydrofluoric acid which contains tetravalent manganese source. The manganese source is not specifically limited as long as it is a chemical compound which contains manganese. Specific examples of the manganese source which can constitute the first solution include $K_2MnF_6$, $KMnO_4$, and $K_2MnCl_6$. Among those, $K_2MnF_6$ is preferable because it can present stably as $MnF_6$ complex ions in hydrofluoric acid while maintaining its oxidation number (tetravalent) which can serve as an activator. Among the manganese sources, a manganese source which at least contains cation which include at least $K^+$ and may further include at least one selected from the group consisting of $Li^+$, $Na^+$, $Rb^+$, $Cs^+$, and $NH_4^+$ can also serve as a cation source which at least includes $K^+$ and may further include at least one selected from the group consisting of $Li^+$, $Na^+$, $Rb^+$, $Cs^+$, and $NH_4^+$, which contained in the second solution. For the manganese source which constitutes the first solution, a single manganese source or a combination of two or more manganese sources can be used.

The lower-limit value of hydrogen fluoride concentration in the first solution is generally 20 mass % or greater, preferably 25 mass % or greater, and more preferably 30 mass % or greater. The upper-limit value of hydrogen fluoride concentration in the first solution is generally 80 mass % or less, preferably 75 mass % or less, more preferably 70 mass % or less. With a concentration of hydrogen fluoride 30 mass % or greater, the stability against hydrolysis of the manganese source (e.g. $K_2MnF_6$) which is a constituent of the first solution can be increased and fluctuation in the tetravalent manganese ion concentration in the first solution can be reduced. Accordingly, the amount of manganese activator contained in the fluoride fluorescent material thus obtained can be controlled easily, and the variation (fluctuation) in luminous efficiency in the fluoride fluorescent material tends to be reduced. In the case of the hydrogen fluoride concentration being 70 mass % or less, a drop in the boiling point can be prevented and generation of hydrogen fluoride gas can be suppressed. Accordingly, the hydrogen fluoride concentration in the first solution can be controlled easily, and the variation or fluctuation in the particle size of the fluoride fluorescent material can be efficiently reduced.

The concentration of the first complex ion in the first solution is not specifically limited. The lower-limit value of the first complex ion concentration in the first solution is generally 0.01 mass % or greater, preferably 0.03 mass % or greater, and more preferably 0.05 mass % or greater. The upper-limit value of the first complex ion concentration in the first solution is generally 50 mass % or less, preferably 40 mass % or less, and more preferably 30 mass % or less.

Second Solution

The second solution contains cations which at least includes $K^+$ and may further include at least one selected from the group consisting of $Li^+$, $Na^+$, $Rb^+$, $Cs^+$, and $NH_4^+$, and hydrogen fluoride, and may further contains other components as necessary. The second solution is, for example, provided as an aqueous solution of hydrofluoric acid which contains cations which at least include $K^+$ and may further include at least one selected from the group consisting of $Li^+$, $Na^+$, $Rb^+$, $Cs^+$, and $NH_4^+$. Specific examples of the ion source containing ions which can be constituent of the second solution include in addition to salts which contain potassium such as KF, $KHF_2$, KOH, KCl, KBr, KI, potassium acetate, and $K_2CO_3$, water-soluble salts such as NaF, $NaHF_2$, NaOH, NaCl, NaBr, NaI, sodium acetate, $Na_2CO_3$, RbF, rubidium acetate, $Rb_2CO_3$, CsF, cesium acetate, $Cs_2CO_3$, $NH_4F$, ammonia water, $NH_4Cl$, $NH_4Br$, $NH_4I$, ammonium acetate, and $(NH_4)_2CO_3$. Among those, $NaHF_2$ is preferable, because $NaHF_2$ is soluble without decreasing the concentration of hydrogen fluoride in the solution, and has a small heat of dissolution which contributes high safety. The ion source which constitutes the second solution may be used singly or in combination of two or more kinds.

The lower-limit value of hydrogen fluoride concentration in the second solution is generally 20 mass % or greater, preferably 25 mass % or greater, and more preferably 30 mass % or greater. The upper-limit value of hydrogen fluoride concentration in the second solution is generally 80 mass % or less, preferably 75 mass % or less, more preferably 70 mass % or less. The lower-limit value of ion concentration of cations in the second solution which at least include $K^+$ and may further include at least one selected from the group consisting of $Li^+$, $Na^+$, $Rb^+$, $Cs^+$, and $NH_4^+$ is generally 5 mass % or greater, preferably 10 mass % or greater, more preferably 15 mass % or greater. The upper-limit value of ion concentration of cations in the second solution which at least include $K^+$ and may further include at least one selected from the group consisting of $Li^+$, $Na^+$, $Rb^+$, $Cs^+$, and $NH_4^+$ is generally 80 mass % or less, preferably 70 mass % or less, more preferably 60 mass % or less.

Third Solution

The third solution contains at least second complex ion which contains at least one selected from Group 4 elements and Group 14 elements in addition to fluorine ions, and may contain other components as necessary. The third solution can be provided, for example, an aqueous solution which contains the second complex ion. The second complex ion preferably includes at least one selected from the group consisting of titanium (Ti), zirconium (Zr), hafnium (Hf), silicon (Si), germanium (Ge), and tin (Sn), more preferably includes silicon (Si) or silicon (Si) and germanium (Ge), and further preferably, the second complex ion is a silicon fluoride complex ion.

For example, in the case of the second complex ion contains silicon (Si), the second complex ion source is preferably a chemical compound which contains silicon and fluorine and has high solubility in the solution. Specific examples of the second complex ion source include $H_2SiF_6$, $Na_2SiF_6$, $(NH_4)_2SiF_6$, $Rb_2SiF_6$, and $Cs_2SiF_6$. Among those, $H_2SiF_6$ is preferable because of its high water-solubility and it's free from impurities of alkaline metal elements. The second complex ion sources which constitute the third solution may be used singly or in combination of two or more kinds.

The lower-limit value of the second complex ion concentration in the third solution is generally 5 mass % or greater, preferably 10 mass % or greater, and more preferably 15 mass % or greater. The upper-limit value of the second complex ion concentration in the third solution is generally 80 mass % or less, preferably 70 mass or less, and more preferably 60 mass % or less.

The mixing method of the first solution, the second solution, and the third solution is not specifically limited, and the mixing may be performed by adding the second solution and the third solution to the first solution while agitating the first solution, or by adding the first solution and the second solution to the third solution while agitating the third solution. The first solution, the second solution, and the third solution may be respectively placed in a container and agitationally mixed.

When the first solution, the second solution, and the third solution are mixed, the first complex ion, the cation which include at least $K^+$ and may further includes at least one selected from the group consisting of $Li^+$, $Na^+$, $Rb^+$, $Cs^+$ and $NH_4^+$ and the second complex ion react at a predetermined ratio and crystals of an intended fluoride having a chemical composition represented by the formula (I) is precipitated. The precipitated crystals can be collected through solid-liquid separation by filtration or the like. The crystals may be washed with a solvent such as ethanol, isopropyl alcohol, water, or acetone. Further, a drying treatment may be performed at a temperature generally 50° C. or greater, preferably 55° C. or greater, more preferably 60° C. or greater, and generally 110° C. or less, preferably 100° C. or less, and more preferably 90° C. or less. The drying time is not specifically limited as long as the water or moisture present on the fluoride crystals is evaporated, and for example, drying may be performed for about 10 hours.

In mixing of the first solution, the second solution, and the third solution, in consideration of a difference between the charge composition of the first to third solutions and the composition of the fluoride to be obtain, it is preferred to appropriately adjust the mixing ratio among the first solution, the second solution, and the third solution so that a fluoride as a product can be obtained with an intended composition.

Second Step

In the second step, a reducing agent is added to the dispersion product containing fluoride particles which is obtained in the first step. It is preferable that the addition of a reducing agent allows for reduction of at least a portion of tetravalent manganese ions in the first complex ions contained in the dispersion product into divalent manganese ions. In the second step, it is preferable that 90 mole % or greater of the first complex ion is reduced, and it is more preferable that 95 mole % or greater is reduced.

The reducing agent is not specifically limited as long as it can reduce the first complex ion. More specifically, hydrogen peroxide, oxalic acid, or the like, can be used for the reducing agent. Among those, hydrogen peroxide is preferable in that it has small effect on the fluoride crystals, such as dissolving the fluoride crystals, and it can reduce the first complex ion to water and oxygen in the end, and thus it is easily used in manufacturing processes and the burden on the environment is small.

The addition amount of the reducing agent is not specifically limited. The addition amount of the reducing agent can be appropriately selected, for example, according to the content of the first complex ion contained in the dispersion product, but the addition amount which does not affect much on the fluctuation of the hydrogen fluoride concentration is preferable. More specifically, the addition amount of the reducing agent is preferably 3 equivalent % or greater, more specifically 5 equivalent % or greater, with respect to the content of the first complex ion contained in the dispersion product other than the fluoride crystals. In the specification, the term "one equivalent" is referred to the number of moles of the reducing agent which reduce one mole of the first complex ion to divalent manganese ion.

The second step may include mixing after adding a reducing agent to the dispersion product. The method of mixing the dispersion product and the reducing agent can be appropriately selected from the methods generally used for mixing, according to the reaction vessel or the like. The temperature in the second step is not specifically limited. For example, the reducing agent can be added at a temperature in a range of 15 to 40° C., and preferably in a range of 23 to 28° C. The atmosphere in the second step is not specifically limited. The reducing agent can be added in an atmospheric air, or may be in an inert gas atmosphere such as in nitrogen gas. The reaction time in the second step is not specifically limited. For example, the reaction time may be 1 to 30 minutes, more preferably 3 to 15 minutes.

Third Step

In the third step, under the presence of hydrogen fluoride, cations which include the second complex ions and at least include potassium ions ($K^+$), and may further include at least one selected from the group consisting of lithium ions ($Li^+$), sodium ions ($Na^+$), rubidium ions ($Rb^+$), cesium ions ($Cs^+$), and ammonium ions ($NH_4^+$), are bring in contact with the fluoride crystals in the dispersion product to which the reducing agent has been added, to obtain a fluoride fluorescent material. Under the presence of hydrogen fluoride, the fluoride crystals are brought in contact with the second complex ion and cations which include the second complex ions and at least include potassium ions ($K^+$), and may further include at least one selected from the group consisting of lithium ions ($Li^+$), sodium ions ($Na^+$), rubidium ions ($Rb^+$), cesium ions ($Cs^+$), and ammonium ions ($NH_4^+$). Thus, for example, on the surfaces of the fluoride crystals, precipitating a fluoride which contains at least one element selected from the group consisting of Group 4 elements and Group 14 elements which are contained in the second complex ions, and contains cations which include potassium ions (K$^+$) and may further contain at least one selected from the group consisting of lithium ions (Li$^+$), sodium ions (Na$^+$), rubidium ions (Rb$^+$), cesium ions (Cs$^+$), and ammonium ions (NH$_4^+$), to obtain a desired fluoride fluorescent material.

The third step can be performed separately after the second step, or the third step can be started after starting and before ending the second step so as to perform both the second step and the third step partially concurrently.

In the third step, the fluoride fluorescent material particles are obtained by bringing the fluoride represented by the formula (I) into contact with the ions which include the second complex ion and at least include potassium ion (K$^+$), and may further include at least one selected from the group consisting of lithium ion (Li$^+$), sodium ion (Na$^+$), rubidium ion (Rb$^+$), cesium ion (Cs$^+$), and ammonium ion (NH$_4^+$). So that it is preferable that the fluoride fluorescent material has a surface region which has a lower tetravalent manganese ion concentration than the tetravalent manganese ion concentration in the inner region and the surface region has a composition represented by the formula (II). In the formula (II), A is a cation which contains at least K$^+$ and may further contain at least one selected from the group consisting of Li$^+$, Na$^+$, Rb$^+$, Cs$^+$, and NH$_4^+$, M is at least one element selected from the group consisting of Group 4 elements and Group 14 elements, and a satisfies 0<a<b.

$$A_2[M_{1-a}Mn^{4+}{}_aF_6] \quad (II)$$

In the formula (II), a and b are not specifically limited as long as satisfying 0<a<b. The value of a can be selected appropriately according to the luminous characteristics, the moisture-resistance, and the like, to be obtained. The value of a can be controlled by adjusting the contact amount of the ions with respect to the fluoride crystals, in which the ions include at least potassium ion (K$^+$) and may further include at least one ion selected from the group consisting of lithium ion (Li$^+$), sodium ion (Na$^+$), rubidium ion (Rb$^+$), cesium ion (Cs$^+$), and ammonium ion (NH$_4^+$).

In the third step, the method of bringing the fluoride crystals in the dispersion product added with a reducing agent in contact with the cation which include the second complex ions and at least potassium ions (K$^+$) and may further include at least one selected from the group consisting of lithium ions (Li$^+$), sodium ions (Na$^+$), rubidium ions (Rb$^+$), cesium ions (Cs$^+$), and ammonium ions (NH$_4^+$) is not specifically limited. Examples of such a method include a preferred method of mixing the dispersion product added with a reducing agent is brought in contact with at least one of a solution which contains cations and a solution which contains second complex ions, in which, the solution which contains cations at least potassium ions (K$^+$) and may further include at least one selected from the group consisting of lithium ions (Li$^+$), sodium ions (Na$^+$), rubidium ions (Rb$^+$), cesium ions (Cs$^+$), and ammonium ions (NH$_4^+$). In a more preferred method, the dispersion product is mixed with at least one of the second solution and the third solution. In a further preferred method, the dispersion product is mixed with the second solution and the third solution. In mixing of the dispersion product and either of a solution which contains cations which includes at least potassium ions (K$^+$), and may further include at least one selected from the group consisting of lithium ions (Li$^+$), sodium ions (Na$^+$), rubidium ions (Rb$^+$), cesium ions (Cs$^+$), and ammonium ions (NH$_4^+$), or a solution which contains the second complex ions, the ions that are not contained in the solution to use may be contained in the dispersion product respectively in an amount necessary in the third step. The second solution and the third solution in the third step may have compositions either similar to or different from that of the second solution and the third solution respectively.

In the case where the third step includes mixing of a dispersion product added with a reducing agent and at least one of a solution which contains ions and a solution which contains a second complex ion. The solution which contains ions at least includes potassium ions (K$^+$) and may further includes at least one selected from the group consisting of lithium ions (Li$^+$), sodium ions (Na$^+$), rubidium ions (Rb$^+$), cesium ions (Cs$^+$), and ammonium ions (NH$_4^+$). The temperature in the third step is not specifically limited. For example, the reducing agent can be added at a temperature in a range of 15 to 40° C., and preferably in a range of 23 to 28° C. The atmosphere in the third step is not specifically limited. The third step can be performed either in ambient atmosphere or in an inert gas atmosphere. The reaction time in the third step is not specifically limited. For example, the reaction time may be 1 to 60 minutes, more preferably 5 to 30 minutes.

In the case where the third step includes mixing the dispersion product added with a reducing agent and at least one of a solution which contains cations and a solution which contain the second complex ion, the addition amount of the solution which contains cations can be selected appropriately according to the luminous characteristics, the moisture-resistance, and the like, to be obtained. The solution which contains cations at least includes potassium ions (K$^+$) and may further includes at least one selected from the group consisting of lithium ions (Li$^+$), sodium ions (Na$^+$), rubidium ions (Rb$^+$), cesium ions (Cs$^+$), and ammonium ions (NH$_4^+$). For example, the addition amount of the second complex ion with respect to the fluoride particles can be 1 mole % to 40 mole %, and preferably 5 mole % to 30 mole %.

The surface region of the particles of a fluoride fluorescent material which has a chemical composition represented by the formula (I) and a surface region which has tetravalent manganese ion concentration lower than the tetravalent manganese ion concentration in an inner region can be formed after the first step of forming a core portion, by using a method which includes a variation.

Variation of Second Step

In a variation of second step, the fluoride crystals obtained in the first step are placed in an aqueous solution which contains ions of at least one alkaline earth metal element and a reducing agent. When placed in an aqueous solution which contains alkaline earth metal ions, a dissolution reaction of fluoride particles occurs and metal ions and fluorine ions which are constituents of the fluoride particles are formed. The fluorine ions react with the alkaline earth metal ions and an alkaline earth metal fluoride is formed on the surfaces of the fluoride crystals. Thus, a surface region in which the concentration of tetravalent manganese ion is lower than that of the inner region can be formed on the fluoride crystals. The alkaline earth metal fluoride formed on a surface region of the fluoride fluorescent material particles can suppress further dissolution reaction of the fluoride particles. In the presence of a reducing agent, the tetravalent manganese ions are reduced to divalent manganese ions, so that formation of manganese dioxide can be suppressed. It is considered that the particles of the fluoride fluorescent material obtained through the variation of second step have a surface region which contains an alkaline earth metal fluoride and also due to the presence of a reducing agent, generation of manganese dioxide on the surfaces of the particles can be suppressed, so that deterioration in the optical output and deviation in the chromaticity can be suppressed for a long period. It is considered that, thus, good long-term reliability can be achieved.

The solution which contains alkaline earth metal ions at least contains alkaline earth metal ions, counterions, and water. Examples of the alkaline earth metal ions include magnesium ions ($Mg^{2+}$), calcium ions ($Ca^{2+}$), and strontium ions ($Sr^{2+}$). Among those, in view of reducing the deviation in the chromaticity and reduction in the optical output, and moisture-resistance, the alkaline earth metal ions preferably includes calcium ions.

The solution which contains alkaline earth metal ions can be obtained as an aqueous solution of a compound which includes an alkaline earth metal which may contain other components (for examples an alcohol such as methanol or ethanol) as needed. Examples of the compounds which contain an alkaline earth metal include nitrate salts of alkaline earth metals (e.g., $Mg(NO_3)_2$, $Ca(NO_3)_2$, $Sr(NO_3)_2$), acetate salts (e.g., $Mg(CH_3CO_2)_2$, $Ca(CH_3CO_2)_2$, $Si(CH_3CO_2)_2$, chlorides (e.g., $MgCl_2$, $CaCl_2$, $SrCl_2$), iodides (e.g., $MgI_2$, $CII_2$, $SrI_2$), and bromides (i.e., $MgBr_2$, $CaBr_2$, $SrBr_2$). Those $SiF_6$ sources may be used singly or in combination of two or more kinds.

The concentration of the alkaline earth metals in the solution which contains the alkaline earth metal ions is not specifically limited. The lower-limit value of the first complex ion concentration in the solution is generally 0.01 mass % or greater, preferably 0.03 mass % or greater, and more preferably 0.05 mass % or greater. The upper-limit value of hydrogen fluoride concentration in the solution b is generally 5 mass % or less, preferably 3 mass % or less, more preferably 2 mass % or less.

With respect to 100 parts by mass of the fluoride crystals, the solution which contains an alkaline earth metal ion is preferably 100 to 3000 parts by mass, and more preferably 200 to 2000 parts by mass. The moisture-resistance can be further improved with such a solution which contains alkaline earth metal ions.

In the presence of the reducing agent, at least a part of tetravalent manganese ions generated by a reaction between the fluoride crystals and the solution which contains alkaline earth metal ions are reduced to divalent manganese ions. More specifically, with the addition of the reducing agent, preferably 90 mole % or greater, more preferably 95 mole % or greater of the tetravalent manganese ions generated by the reaction between the fluoride crystals and the solution which contains alkaline earth metal ions are reduced.

The reducing agent is not specifically limited as long as it can reduce the tetravalent manganese ions. More specifically, hydrogen peroxide, oxalic acid, or the like, can be used for the reducing agent. Among those, hydrogen peroxide is preferable because hydrogen peroxide can reduce manganese without adversely affecting the base body of the fluoride crystals, such as dissolving the fluoride crystals, and hydrogen peroxide can be broken into harmless water and oxygen, thus, easily handled in the manufacturing steps and has a low impact on the environment.

The addition amount of the reducing agent is not specifically limited. The addition amount of the reducing agent can be appropriately selected, for example, according to the content of the manganese contained in the fluoride crystals, but the addition amount which does not affect much on the base member of the crystals of the fluoride is preferable. More specifically, the addition amount of the reducing agent is preferably 1 equivalent % or greater, more specifically 3 equivalent % or greater, with respect to the content of the manganese contained in the fluoride crystals.

In the specification, the term "one equivalent" is referred to the number of moles of the reducing agent which reduce one mole of the tetravalent manganese ions to divalent manganese ions.

The lower-limit value of the reducing agent concentration to the solution which contains alkaline earth metal ions can be for example 0.01 mass % or greater, preferably 0.03 mass % or greater, and more preferably 0.05 mass % or greater. The upper-limit value of the reducing agent concentration to the solution which contains alkaline earth metal ions can be for example 5 mass % or less, preferably 3 mass % or less, and more preferably 2 mass % or less.

Contact Method

The method for bringing the fluoride crystals and the solution which contains an alkaline earth metal ion is not specifically limited. For example, mixing of a solution which contains a reducing agent, the fluoride crystals, and alkaline earth metal ions can be employed.

Contact Time

The contact time of the fluoride crystals and the solution which contains alkaline earth metal ions in the presence of a reducing agent is not specifically limited as long as the contact time is sufficient to form the alkaline earth metal fluoride on the surfaces of the fluoride crystals. For example, the contact time can be 10 minutes to 10 hours, and preferably 30 minutes to 5 hours.

Reaction Temperature

The temperature of mixing the reducing agent, the fluoride crystals and the solution which contains alkaline earth metal ions is not specifically limited. For example, the mixing can be performed at a temperature in a range of 15 to 40° C., and preferably in a range of 23 to 28° C. The atmosphere of the mixing is not specifically limited. The mixing can be performed either in ambient atmosphere or in an inert gas atmosphere such as in nitrogen gas.

Other Steps

A method of manufacturing a fluoride fluorescent material may further include providing a fluoride which has a chemical composition represented by the formula (I). The crystals of the fluoride fluorescent material generated in the third step can be collected by solid-liquid separation, e.g., filtration. The crystals of the fluoride fluorescent material may be washed with a solvent such as ethanol, isopropyl alcohol, water, or acetone. Further, drying treatment may be performed at a temperature generally 50° C. or greater, preferably 55° C. or greater, more preferably 60° C. or greater, and generally 110° C. or less, preferably 100° C. or less, and more preferably 90° C. or less. The drying time is not specifically limited as long as the water or moisture present on the crystals of the fluorescent material can be evaporated, and for example, drying may be performed for about 10 hours.

Other Fluorescent Materials

The light emitting device preferably includes one or more other fluorescent materials in addition to the fluoride fluorescent material. Other fluorescent materials can absorb light emitted from a light source and converts it to light of different wavelength. Other fluorescent materials can be contained in a sealing material as the fluoride fluorescent material described above, and can be a constituent of a light emitting device. For example, at least one selected from the group consisting of the below can be preferably used as the other fluorescent materials. Such other fluorescent materials include nitride-based fluorescent materials, oxynitride-based fluorescent materials, and saialon-based fluorescent materials which are activated mainly with a lanthanoid element such as europium, cerium; alkaline-earth metal halogen apatite fluorescent materials, alkaline-earth metal haloborate fluorescent materials, alkaline-earth metal aluminate fluorescent materials, alkaline-earth metal silicates, alkaline-earth metal sulfides, alkaline-earth metal thiogallates, alkaline-earth metal silicon nitrides, and germinates, which are activated mainly with a lanthanoid element such as europium or a transition metal element such as manganese, rare-earth aluminates and rare-earth silicates, which are activated mainly with a lanthanoid element such as cerium, and organic compounds and organic complexes which are activated mainly with a lanthanoid element such as europium. Specific examples of other fluorescent materials include $(Ca,Sr,Ba)_2SiO_4$:Eu, $(Y,Gd)_3(Ga,Al)_5O_{12}$:Ce, $(Si,Al)_6(O,N)_8$:Eu(β-sialon), $SrGa_2S_4$:Eu, $(Ca,Sr)_2Si_5N_8$:Eu, $CaAlSiN_3$:Eu, $(Ca,Sr)AlSiN_3$:Eu, $Lu_3Al_5O_{12}$:Ce, and $(Ca,Sr,Ba,Zn)_8MgSi_4O_{16}(F,Cl,Br,I)_2$:Eu. With other fluorescent materials, light emitting devices for various color tones can be provided. In the case where the light emitting device further includes another fluorescent material, the content is not specifically limited and can be adjusted so that a desired luminous characteristic can be attained.

In the case of the light emitting device further including one or more other fluorescent materials, a fluorescent material to emit light of green to yellow light is preferable. More preferably, a fluorescent material which can absorb light in a wavelength range of 380 nm to 485 nm and emit light of green to yellow light which has an emission peak wavelength in a range of 495 nm to 590 nm is more preferably contained. The light emitting device includes a fluorescent material which can emit light of green to yellow color, so that it can be applied more suitably to liquid crystal display devices.

It is preferable that the fluorescent material to emit light of green to yellow color can be one or more selected from a group consisting of a β-sialon fluorescent material represented by a composition formula of $(Si,Al)_6(O,N)_8$:Eu, a thiogallate fluorescent material represented by a composition formula of $SrGa_2S_4$:Eu, a halosilicate fluorescent material represented by a composition formula of $(Ca,Sr,Ba,Zn)_8MgSi_4O_{16}(F,Cl,Br,I)_2$:Eu, or a rare earth aluminate fluorescent material represented by a composition formula $(Y,Lu)_3(Al,Ga)_5O_{12}$:Ce. Those materials may be used singly or in combination of two or more kinds.

Content of Fluorescent Material in Sealing Member

The content of the fluorescent material in the sealing material is preferably 10 to 200 parts by mass to 100 parts by mass of the binder. With respect to 100 parts by mass of the binder, the fluorescent material is more preferably 20 to 180 parts by mass, further preferably 30 to 120 parts by mass, particularly preferably 40 to 100 parts by mass, and most preferably 40 to 80 parts by mass. With the content of the fluorescent material in the sealing material being in such a range described above, the light emitting element can be sufficiently covered, so that the wavelength of the light emitted from the light emitting element can be efficiently converted by the fluorescent materials and the light can be efficiently emitted. Further, with the content of the fluorescent material in the sealing material being 10 to 200 parts by mass with respect to 100 parts by mass of the binder, a first portion 9 which includes the fluorescent materials 7, 8, which covers the light emitting element 4 with a uniform thickness, and a second portion 10 which has a thickness of one tenth or greater with respect to the entire thickness of the sealing member at directly above the light emitting element 4 can be formed.

Content of Fluorescent Material in First Portion

With respect to 100 parts by mass of the binder, the fluorescent material is more preferably 20 to 400 parts by mass, further preferably 25 to 380 parts by mass, particularly preferably 30 to 350 parts by mass, and most preferably 35 to 300 parts by mass. With the content of the fluorescent material contained in the first portion being in the range described above, the light emitting element can be covered with the fluorescent material with a uniform thickness, so that the wavelength of the light emitted from the light emitting element can be efficiently converted by the fluorescent materials.

Mass Ratio of Green-Yellow Fluorescent Material to Red Fluorescent Material

In the case where the fluorescent material includes a red fluorescent material, that is the fluoride fluorescent material to emit red light and one or more fluorescent materials to emit green to yellow light, the mass ratio of the fluorescent material to emit green to yellow light to the red fluorescent material (fluorescent material to emit green to yellow light:red fluorescent material) is preferably 5:95 to 95:5, more preferably 10:90 to 90:10, further preferably 20:80 to 80:20, and particularly preferably 30:70 to 70:30. In the case where the fluorescent material includes a red fluorescent material and one or more fluorescent materials to emit green to yellow light at a ratio in a range described above, upon absorbing the light from the light emitting element, a light which has a narrow half-value width of emission spectrum due to the red fluorescent material containing a fluoride as in the formula (I), and an emission spectrum of green to yellow fluorescence with a peak which is relatively widely spaced apart from the peak of the red fluorescence can be emitted with a wide color reproduction range and a high luminance.

Filler

The sealing material may contain a filler. The filler is preferably an inorganic filler. Examples of such an inorganic filler include titanium oxide, zinc oxide, alumina, silica, zirconia, barium titanate, calcium phosphate, calcium carbonate, white carbon, talc, carbonate magnesium, boron nitride, and glass fiber. Among those, the filler is preferably alumina, silica, or zirconia. The filler may have a shape such as a spherical shape, a scale-like shape, or crushed products of a mass or agglomerates, and of those, a spherical shape is preferable. The filler preferably has a volume average particle size (median diameter: d50) of 1 µm to 100 µm, measured by using a laser diffraction and scattering type particle size distribution measuring device. The filler more preferably has a volume average particle size (median diameter: d50) of 2 µm to 80 µm, further preferably 2 µm to 60 µm, and particularly preferably 2 µm to 50 µm, measured by using a laser diffraction and scattering type particle size distribution measuring device.

The content of the filler in the sealing material is not specifically limited. With respect to 100 parts by mass of the binder, the content of the filler in the sealing material is preferably 0.1 to 50 parts by mass, more preferably 1 to 30 parts by mass, further preferably 3 to 20 parts by mass, and particularly preferably 5 to 15 parts by mass. Containing of a 5 to 15 parts by mass of the filler with respect to 100 parts by mass of the binder allows for improving the dispersibility. For example, in the case where in addition to the red fluorescent material, one or more fluorescent materials to emit green to yellow light is further contained, the red fluorescent material and one or more fluorescent materials to emit green to yellow light can be uniformly dispersed. In the case where a filler is contained in the sealing material, the fluorescent material can be centrifugally sedimented to uniformly cover the light emitting element. Thus, the first portion can be formed. Covering the light emitting element by the first portion in a state in which the fluorescent material to emit green to yellow light and the red fluorescent material being uniformly dispersed, color deviation can be improved, the fluorescent material can be efficiently excited, and the visible light can be efficiently utilized. The filler may be contained in the first portion with the fluorescent material, or may be contained in the second portion.

Nano-Filler

A nano-filler may be contained in the sealing material which is a constitutive component of the sealing member, before the sealing material is cured. The nano-filler can have a volume average particle size (median diameter: d50) of the secondary particles of 5 nm to 1000 nm, preferably 10 nm to 200 nm, more preferably 20 nm to 180 nm, further preferably 30 μm to 150 μm, particularly preferably 40 μm to 120 μm, and most preferably 50 nm to 100 nm, measured by using a laser diffraction and scattering type particle size distribution measuring device. For the material of the nano-filler, for example, at least one inorganic material selected from the group consisting of inorganic oxides, metal nitrides, metal carbides, carbon compounds, and sulfides. Examples of such inorganic oxides include titanium oxide, tantalum oxide, niobium oxide, tungsten oxide, zirconium oxide, zinc oxide, indium oxide, tin oxide, hafnium oxide, yttrium oxide, silicon oxide, and aluminum oxide. Also, a composite inorganic oxide of those can be used. Examples of metal nitrides include silicon nitride. Examples of metal carbides include silicon carbide. Examples of carbon compounds include light-transmissive inorganic materials such as diamond or diamond-like carbons, which are carbon-elemental substances. Examples of sulfides include copper sulfide and tin sulfide. Among those, silicon oxide is preferable for the material of the nano-filler. The filler may be contained in the first portion with the fluorescent material, or may be contained in the second portion.

The content of nano-filler in the sealing material is not specifically limited. With respect to 100 parts by mass of the binder, the fluorescent material is preferably 0.1 to 5.0 parts by mass, more preferably 0.2 to 4.0 parts by mass, further preferably 0.3 to 3.0 parts by mass, and particularly preferably 0.4 to 2.0 parts by mass. Containing of a 0.1 to 5.0 parts by mass of the nano-filler with respect to 100 parts by mass of the binder allows the nano-filler disposed around the fluorescent material particles. However, it is considered that in the case of such a conventional fluoride fluorescent material activated with $Mn^{4+}$, tetravalent manganese ions which are constituent components of the fluoride fluorescent material and present on the fluorescent material particles may react with atmospheric moisture to generate manganese dioxide which darkens the surfaces of the particles, resulting in occurrence of deviation in the chromaticity and reduction in the optical output. In the case of containing the nano-filler in the sealing member, the nano-filler can adhere to the circumference of the particles of the fluoride fluorescent material, so that reaction between the moisture and the tetravalent manganese ions can be further suppressed, and thus discoloration of the surfaces of the particles due to generation of manganese dioxide can be suppressed. Accordingly, in the light emitting device according to the present disclosure, deterioration in the optical output and deviation in the chromaticity can be suppressed and more excellent durability can be achieved in a long-term reliability test.

Inclusion of a nano-filler in the sealing material allows substantially uniform dispersion of the fluorescent material, the filler and the nano-filler when needed, in the binder. Thus, before injecting or at the time of injecting the sealing material which is to be a sealing member, in the recess of the package, the fluorescent material, and the filler and the nano-filler as needed, can be injected with a substantially uniform amount in the recess of each package. Accordingly, a light emitting device with little diversion in the color tone among the packages can be obtained.

Other Materials

The sealing member which is a constitutive component of the sealing member and before being cured at least includes a binder and a fluorescent material, and may include a filler and a nano-filler as needed. In addition to those, in the case where the binder is made of a resin, a curing agent for hardening the resin may also be contained. In the sealing material, a dye, a pigment, or the like may be contained. Voids for dispersing light may be formed in the sealing member to a degree so as not to adversely affect the reliability of the sealing member.

Method of Manufacturing Sealing Material

The method of manufacturing the sealing material is not specifically limited and the order of mixing the materials is not also specifically limited. Examples of the method of manufacturing the sealing material include a method of simultaneously mixing predetermined amount of each material, and a method of successively mixing predetermined amount of each material. The sealing material is preferably manufactured by successively introducing a fluorescent material, if needed a filler, if needed a nano-filler, a binder, and other materials in this order into a vessel while agitating.

Method of Manufacturing Light Emitting Device

A method of manufacturing a light emitting element includes steps of: providing a package having side walls which define a recess; disposing a light emitting element on bottom of the recess; injecting a sealing material in the recess of the package, the sealing material including particles of a fluoride fluorescent material having a chemical composition represented by the following formula (I), and a surface region which has a tetravalent manganese ion concentration lower than a tetravalent manganese ion concentration in an inner region of the fluorescent material particles, and a binder; disposing an uncured sealing member which includes a first portion and a second portion by centrifugally sedimenting the fluorescent material toward a bottom surface in the recess to form the first portion which contains the fluorescent material and covers the light emitting element and the second portion which substantially does not contain the particles of the fluoride fluorescent material and is located above the first portion; and forming the sealing member by curing the sealing material.

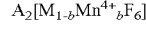   (I)

In the formula (I), A is a cation which contains at least $K^+$ and may further contain at least one selected from the group consisting of $Li^+$, $Na^+$, $Rb^+$, $Cs^+$, and $NH_4^+$, M is at least one element selected from the group consisting of Group 4 elements and Group 14 elements, and $0<b<0.2$. In the below, a method of manufacturing a light emitting device will be described with reference to FIG. 1.

Providing Package

A package 3 which has side walls defining a recess 2 is provided. In the package 3, a first lead 5 and a second lead 6 are integrally formed as a bottom surface defining the recess 2.

Arranging Light Emitting Element

A light emitting element 4 is disposed and die-bonded on the first lead 5 which constitutes the bottom surface of the recess of the package 3. The positive and negative electrodes of the light emitting element 4 are respectively connected to the first lead 5 and the second lead 6 through the corresponding wires 11, 12. A method of manufacturing a light emitting device according to an embodiment of the invention may include covering the light emitting element 4, the first lead 5, the second lead 6, and the wires 11, 12 with an insulating member. It is preferable that the insulating member is made of an inorganic compound disposed in a form of a film (or a layer) disposed on the electrically conductive member, the wires 11, 12, and the light emitting element 4, by using sputtering, vapor deposition, or the like. The film (or a layer) of the insulating member is preferably formed by using atomic layer deposition method.

Injecting Sealing Member

Next, in the recess 2 of the package 3, a sealing material which at least contains a resin and fluorescent materials 7, 8 is injected to fill the recess 2 with the sealing material. The sealing material is injected in a plurality of recesses 2 in each of a plurality of arranged packages 3, preferably by using a syringe or the like. The sealing material may contain a filler, a nano-filler or other materials, as needed.

Centrifugal Sedimentation of Fluorescent Material

The package 3 with the recess 2 filled with the sealing material is subjected to a centrifugal force so that the particles of the fluoride fluorescent materials 7 and other fluorescent material particles in the sealing material are centrifugally sedimented to cover the light emitting element 4. Then, with the sealing material, the first portion 9 which covers the light emitting element 4 and contains the fluorescent material particles and the second portion 10 which is arranged over the first portion 9 and substantially does not contain the fluorescent material particles are formed. The fluorescent material particles are preferably centrifugally sedimented by placing the package 3 with the recess 2 filled with the sealing material in a magazine and rotating in the centrifuge device until a sufficient sedimentation is obtained.

The centrifugal sedimentation of the fluorescent material particles is performed with a direction of a resultant force of a centrifugal force and gravitational force aligned with a direction perpendicular to the bottom surface of the recess of the package. In the specification, the term "bottom surface of the package" includes the first lead 5 and the second lead 6 on which the light emitting element is mounted. The centrifugal sedimentation of the fluorescent material particles is performed with a direction of a resultant force of a centrifugal force and gravitational force aligned with a direction perpendicular to the bottom surface of the recess of the package, so that the fluorescent material particles dispersed in the sealing material can be sedimented with a substantially uniform thickness on the light emitting element and the bottom surface of the package, and thus, the first portion 9 with a substantially uniform thickness can be formed.

It is preferable that the centrifugal sedimentation of the fluorescent material particles is performed so that the thickness of the second portion is one tenth or greater with respect to the entire thickness of the sealing member. Appropriately adjusting the conditions of centrifugal sedimentation, the type and amount of the binder in the sealing material, and the type and amount of the fluorescent material, the thickness of the second portion 10 can be adjusted. Centrifugally sedimenting the fluorescent material particles with appropriately setting those conditions, the fluorescent material particles can be centrifugally sedimented so that the thickness of the second portion is one tenth or greater with respect to the total thickness of the sealing material.

It is further preferable that the centrifugal sedimentation of the fluorescent material particles is performed so that a thickness of the second portion 10 at directly above the light emitting element 4 is one fourth or greater with respect to the total thickness of the sealing material. Appropriately adjusting the conditions of centrifugal sedimentation, the type and amount of the binder in the sealing material, and the type and amount of the fluorescent material, the thickness of the second portion 10 can be adjusted. Centrifugally sedimenting the fluorescent material particles with appropriately setting those conditions, the fluorescent material particles can be centrifugally sedimented so that the thickness of the second portion is one fourth or greater with respect to the total thickness of the sealing material.

Curing Sealing Material

After the fluorescent material particles are centrifugally sedimented, the binder is cured. Thus, a light emitting device can be obtained, in which a sealing member is formed with the sealing material filled in the recess 2 of the package 3 and has the first portion which contains the fluorescent material and covers the light emitting element and the second portion arranged above the first portion and substantially does not include the fluorescent material. The method of curing the binder is not specifically limited and the curing method can be appropriately selected according to the type of the binder.

Image Display Device

The image display device has at least one of the light emitting device described above. An image display device is not specifically limited as long as manufactured according to a method as described above or includes a light emitting device and a color filter which are described above, and the configuration thereof can be appropriately selected from a conventionally known image display device. The image display device may be constituted with, in addition to the light emitting device, a color filter member and a controlling member for optical transmission, and so forth.

EXAMPLES

The present invention will be described below more specifically with examples the present invention is not limited by the examples shown below.

Manufacturing Example 1 of Fluoride Fluorescent Material

In order to satisfy the charge ratio shown in Table 1, 21.66 g of $K_2MnF_6$ was weighed and dissolved in 800 g of 55 mass % of HF aqueous solution. Then, 400 g of 40 mass % $H_2SiF_6$ aqueous solution, to obtain the solution A. Meanwhile, 260.14 g of KHF was weighed, and dissolved in 450 g of a 55 mass % HF aqueous solution, to obtain the solution B. Also, 200 g of 40 mass % $H_2SiF_6$ aqueous solution was weighed as the solution C. Next, at room temperature (23 to 28° C.), the solution B and the solution C were simultaneously added in drops while agitating the solution A to precipitate the fluorescent material crystals (fluoride particles), and as shown in Table 2, dropping was temporarily stopped at the time of finishing 75 mass % of dropping of each of the solution B and the solution C (first step). As the reducing agent, 15 g of 30 mass % $H_2O_2$ aqueous solution was added to the solution A (second step), and then, dropping of the solution B and the solution C was resumed (third step). After finishing the dropping of the solution B and the solution C, the precipitate was separated and washed with IPA (isopropyl alcohol), and dried at 70° C. for 10 hours to obtain the fluoride fluorescent material that has composition of $K_2[Si_{0.97}Mn^{4+}_{0.03}F_6]$ of Manufacturing Example 1.

TABLE 1

| | Charge Composition Ratio (mol) | | | | | Solution A Charged Amount (g) | | Solution B Charged Amount (g) | Solution C Charged Amount (g) | Reducing Agent (g) |
|---|---|---|---|---|---|---|---|---|---|---|
| | | | | | | 40% $H_2SiF_6$ aqueous solution | 55% HF aqueous solution | 55% HF aqueous solution | 40% $H_2SiF_6$ aqueous solution | 30% $H_2O_2$ aqueous solution |
| | K | Si | Mn | F | $K_2MnF_6$ | | | $KHF_2$ | | |
| Manufacturing Example 1 | 2 | 0.95 | 0.05 | 6 | 21.66 | 400 | 800 | 280.14 | 450 | 200 | 15 |

TABLE 2

| | Dropping rate before adding reducing agent (%) | |
|---|---|---|
| | Solution B | Solution C |
| Manufacturing Example 1 | 75 | 75 |

Example 1

Manufacturing of Sealing Material

As the red fluorescent material, the fluoride fluorescent material according to the manufacturing example 1 was used. As the fluorescent material to emit green to yellow light, a β-sialon fluorescent material of $(Si,Al)_6(O,N)_8$:Eu was used. The fluorescent material to emit green to yellow light and the red fluorescent material are blended at a mass ratio of the mass of a fluorescent material to emit green to yellow light with respect to the mass of red fluorescent material to be 27:73. The binder is a resin and a phenyl silicone (Dow Corning (registered trademark: OE-6630) was used. For the filler, silica which has a volume average particle size of 11 μm (median diameter: d50), measured by using a laser diffraction and scattering type particle size distribution measuring device (Malvern Master Sizer 2000) was used. For the filler, silicon oxide (AEROSIL (registered trademark)) which has a volume average particle size of secondary particles of 12 nm (median diameter: d50), measured by using a laser diffraction and scattering type particle size distribution measuring device (Malvern Master Sizer 2000) was used. More specifically, the method can be performed as described below. In the sealing material of 100 mass %, the content of the resin can be 91.1 mass %. In an agitation vessel, fluorescent materials (red fluorescent material and fluorescent material to emit green to yellow light) are placed, then, a filler and a nano-filler are placed. As a final, a resin and a hardening agent were placed in the agitation vessel, and agitated for about five minutes to obtain the sealing material 1.

Sealing Material

| | |
|---|---|
| Binder (Main Agent: Silicone Resin) | 100 parts by mass. |
| Red fluorescent material (fluoride fluorescent material according to manufacturing example 1) | 31.57 parts by mass (43.25 parts by mass × 0.73). |
| Fluorescent material to emit green to yellow light (β-sialon) | 11.68 parts by mass (43.25 parts by mass × 0.27) |
| filler (silicon oxide) | 5 parts by mass |
| nano-filler (silicon oxide: $SiO_2$) | 0.4 parts by mass |
| curing agent (liquid silicone resin) | 400 parts by mass |

Method of Manufacturing Light Emitting Device

A package having side walls which define a recess was prepared and a light emitting element was disposed in the recess. Then, a sealing material 1 was injected in the recess of the package by using a syringe. The light emitting element with an emission peak wavelength in a range of 380 nm to 485 nm was used. Next, the package 3 with the recess 2 filled with the sealing material 1 was placed in a magazine and centrifugally rotated to centrifugally sedimenting a fluorescent material contained in the sealing material to obtain a first portion which contains the fluorescent material and covers the light emitting element and the second portion located above the first portion and substantially does not include the fluorescent material. Before curing, the thickness of the second portion at directly above the light emitting element was one fourth or greater with respect to the entire thickness of the sealing member. More specifically, at directly above the light emitting element, the thickness of the sealing member was 410 μm, the thickness of the first portion was 150 μm, and the thickness of the second portion was 260 μm. In the step of centrifugally sedimenting the fluorescent material particles, the direction of the sum of centrifugal force and gravity was maintained substantially perpendicular to the bottom surface of the recess disposed with the light emitting element. Then, the sealing material was cured to form the first portion which contains the fluorescent material and covers the light emitting element and the second portion located above the first portion and substantially does not include the fluorescent material. Thus, a light emitting device of Example 1 was obtained.

Figure 2:
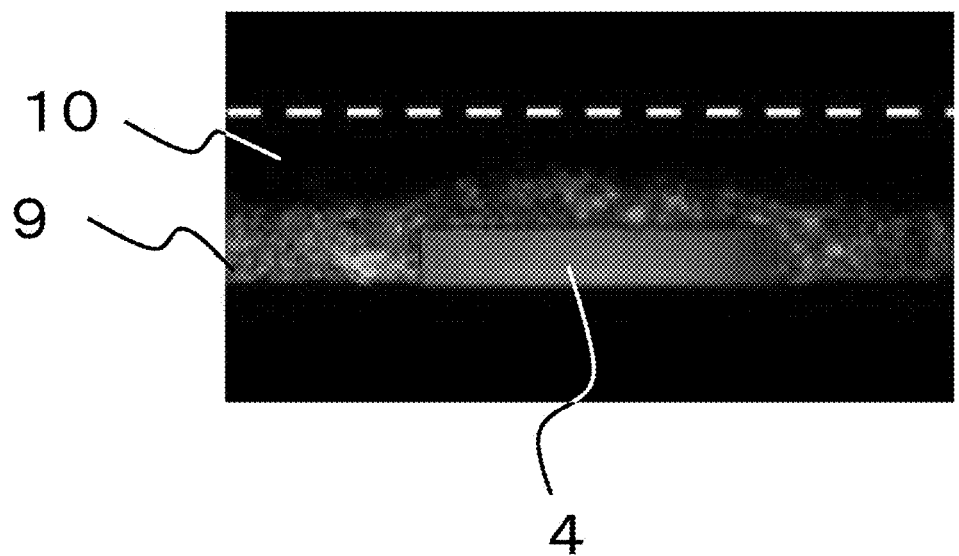
FIG. 2 is a diagram showing a fluorescent microscope image of an enlarged cross section of a light emitting device according to an embodiment.

FIG. 2 is a diagram showing a 20-power fluorescent microscope image of a cross section of a light emitting device according to Example 1. As shown in FIG. 2, the light emitting device 1 of Example 1 is confirmed to have a first portion 9 which contains a fluorescent material and covers the light emitting element 4, and a second portion 10 located above the first portion 9 and substantially does not contain the fluorescent material.

Comparative Example 1

A light emitting device of Comparative Example 1 was obtained in a similar manner as in Example 1, except that the fluorescent material in the sealing material was not subjected to centrifugal sedimentation and the sealing member which includes the first portion and the second portion was not formed. In the light emitting device of Comparative Example 1, the fluorescent material was approximately uniformly dispersed in the sealing member.

PCT (Pressure Cooker Test)

Pressure cooker test (PCT) was performed on the light emitting devices obtained in Example 1 and Comparative Example 1, at 121° C., 100% humidity, and 2 atm. The results are shown in FIGS. 3A to 3D.

Figure 3A:
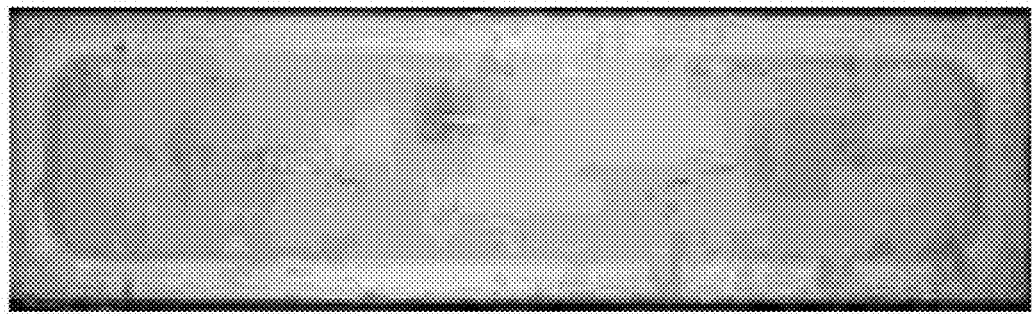
FIG. 3A is a diagram showing a PCT result of a light emitting device according to Example 1 for 200 hours
Figure 3B:
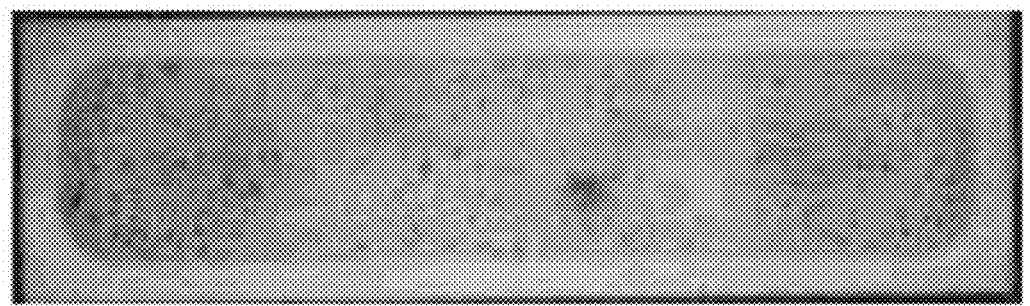
FIG. 3B is a diagram showing a PCT result of a light emitting device according to Comparative Example 1 for 4 hours
Figure 3C:
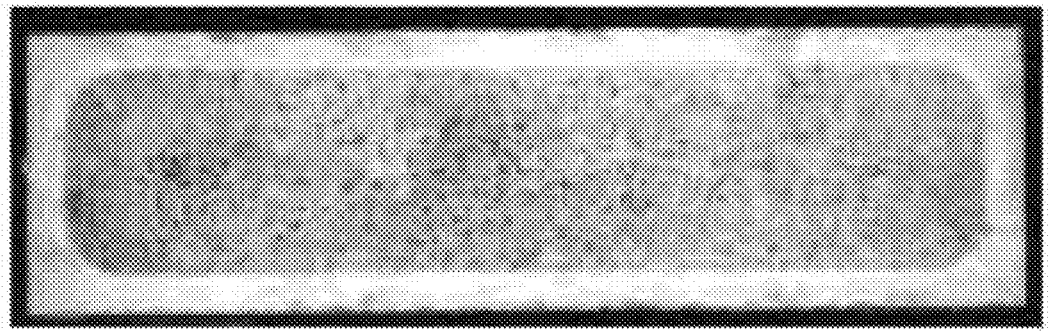
FIG. 3C is a diagram showing a PCT result of a light emitting device according to Comparative Example 1 for 100 hours
Figure 3D:
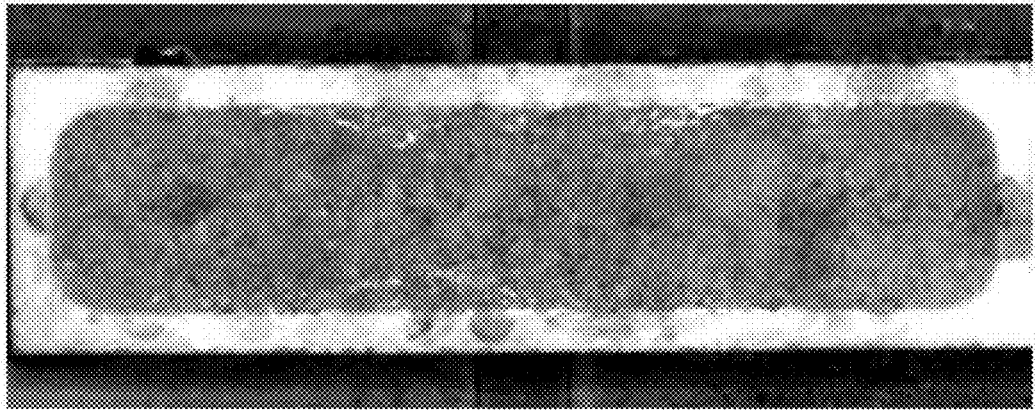
FIG. 3D is a diagram showing a PCT result of a light emitting device according to Comparative Example 1 for 200 hours

As shown in FIG. 3A, the light emitting device obtained in Example 1 of the present invention did not show discoloration on the surface of the light emitting device even after the passage of 200 hours of the PCT. On the other hand, as shown in FIG. 3C, discoloration on the surface of the light emitting device obtained in Comparative Example 1 was confirmed after 4 hours of the PCT. As shown in FIG. 3C, in the light emitting device of Comparative Example 1, discoloration of the surface of the light emitting device was progressed after 100 hours of PCT, and as shown in FIG. 3D, in the light emitting device of Comparative Example 1, discoloration of the surface of the light emitting device was further progressed after 200 hours of PCT. With the occurrence of discoloration, light is absorbed by the discolored parts which may result in color deviation and deterioration in the optical output. As the results shown in FIGS. 3A to 3D, good durability of the light emitting device of Example 1 according to the present invention is confirmed.

Examples 2 to 4, Comparative Examples 2 to 4, and Reference Example

The light emitting devices were fabricated in a similar manner as in Example 1 except for using the red fluorescent materials to emit red light and the fluorescent materials to emit green to yellow light as shown in Table 3. Also, as a light emitting device of Reference Example, YAG is used as the fluorescent material. Each of the light emitting devices of Reference Example, Examples 2 to 4, and Comparative Examples 2 to 4 has a sealing member which includes a first portion which contains one or more fluorescent materials and covers the light emitting element and a second portion arranged above the first portion and substantially does not contain a fluorescent material.

NTSC Ratio

The light emitting devices obtained in Reference Example, Examples 2 to 4, and Comparative Examples 2 to 4 were respectively assembled in image display devices. The NTSC ratio of each image display device was measured. The NTSC ratio is the ratio of the area of a triangle defined by three chromaticity points red, green, blue of the display apparatus to be evaluated to the area of a triangle defined by the chromaticity points of three primary colors, red (0.670, 0.330), green (0.210, 0.710) and blue (0.140, 0.080), of the standard chromaticity (x, y) according to the CIE 1931 XYZ display color system established by the National Television Standards Committee of the USA. The area ratio described above is defined as a color reproduction range and it is determined the higher the ratio the higher is the color reproductivity. It is preferable that an image display device satisfies a color reproduction range of a NTSC ratio being 70% or greater, on the CIE 1931 chromaticity diagram.

sRGB

The light emitting devices obtained in Reference Example, Examples 2 to 4, and Comparative Examples 2 to 4 were respectively assembled in image display devices. The sRGB ratio of each image display device was measured. The sRGB ratio is the ratio of the area of a triangle defined by three chromaticity points red, green, blue of the display apparatus to be evaluated to the area of a triangle defined by the chromaticity points of three primary colors, red (0.640, 0.330), green (0.300, 0.600) and blue (0.150, 0.060), of the standard chromaticity (x, y) according to the CIE 1931 XYZ display color system established by the International Electrotechnical Commission. The area ratio described above is defined as a color reproduction range and it is determined the higher the ratio the higher is the color reproductivity.

Relative Luminous Flux of LED

Luminous flux of the light emitting devices obtained in Reference Example, Examples 2 to 4, and Comparative Examples 2 to 4 was respectively measured by integrating sphere and relative luminous flux was calculated based on luminous flux of Reference Example.

The measurement results of the NTSC ratio, the sRGB, and the relative luminous flux of the light emitting devices obtained in Reference Example, Examples 2 to 4, and Comparative Examples 2 to 4 are shown in Table 3. In Table 3, the values in parentheses shown under each fluorescent material indicates the maximum wavelength in the emission spectrum of each fluorescent material.

TABLE 3

| | Fluorescent material | | | | Relative |
|---|---|---|---|---|---|
| | Green fluorescent material | Red fluorescent material | NTSC | sRGB (U'V' Area) | luminous flux of LED |
| Reference Example | | YAG | 70% | 100% | 100 |
| Example 2 | β-sialon (540 nm) | Manufacturing Example 1 (630 nm) | 90% | 135% | 87 |
| Example 3 | β-sialon (535 nm) | Manufacturing Example 1 (630 nm) | 93% | 137% | 82 |
| Example 4 | β-sialon (531 nm) | Manufacturing Example 1 (630 nm) | 96% | 139% | 75 |
| Comparative Example 1 | β-sialon (540 nm) | CASN (660 nm) | 77% | 123% | 68 |
| Comparative Example 2 | β-sialon (535 nm) | CASN (660 nm) | 80% | 127% | 64 |
| Comparative Example 3 | β-sialon (531 nm) | CASN (660 nm) | 83% | 130% | 58 |

As shown in Table 3, the light emitting devices of Examples 2 to 4 with the fluorescent material of Manufacturing Example 1 exhibit all the NTSC ratio, the sRGB, and the relative luminous flux (LED) superior to those obtained by the light emitting devices of Comparative Examples 2 to 4 with the fluorescent materials other than the fluorescent material of Manufacturing Example 1, and exhibit an improvement in both the color reproductivity and the relative luminous flux. Compared to the relative luminous flux 100 of the light emitting device of Reference Example, the relative luminous fluxes of the light emitting devices of Comparative Examples 2 to 4 showed lower values of 58, 64, 68, respectively, but the relative luminous fluxes of the light emitting devices of Examples 2 to 4 showed improved values of 87, 82, and 75, compared to that of Comparative Examples 2 to 4.

In the light emitting device according to the present disclosure, deterioration in the optical output and color deviation are suppressed. Thus, the light emitting device according to the present disclosure can be advantageously used particularly for light sources of white lighting which use blue light emitting diodes as their light source, backlight light sources, LED displays, signals, pilot light switches, various sensors, and various indicators, and particularly, in lighting applications, exhibits superior durability and luminous characteristics.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A light emitting device comprising:
a package having side walls which define a recess;
a light emitting element arranged in the recess; and
a sealing member which seals the light emitting element;
wherein the sealing member comprises:
    a first sealing member portion covering the light emitting element, the first sealing member portion comprising a first binder portion, and fluorescent material particles located in the first binder portion, and
    a second sealing member portion covering the first sealing member portion, the second sealing member portion comprising a second binder portion, and substantially no fluorescent material particles located in the second binder portion,
wherein the fluorescent material particles include particles of a fluoride fluorescent material that is activated with tetravalent manganese ions and has a chemical composition represented by the following formula (I), $$A_2[M_{1-b}Mn^{4+}_bF_6] \quad\quad (I)$$

wherein A is a cation which contains at least $K^+$ and may further contain at least one selected from the group consisting of $Li^+$, $Na^+$, $Rb^+$, $Cs^+$, and $NH_4^+$, M is at least one element selected from the group consisting of Group 4 elements and Group 14 elements, and $0<b<0.2$, and
wherein the particles of fluoride fluorescent material include a surface region and an inner region, both the surface region and the inner region comprising tetravalent manganese ions, and
wherein a tetravalent manganese ion concentration of the surface region of the particles of fluoride fluorescent material is lower than a tetravalent manganese ion concentration of the inner region of the particles of fluoride fluorescent material.

2. The light emitting device according to claim 1, wherein a thickness of the second sealing member portion directly above the light emitting element is one tenth or greater with respect to an entire thickness of the sealing member.

3. The light emitting device according to claim 1, wherein a thickness of the second sealing member portion directly above the light emitting element is one forth or greater with respect to an entire thickness of the sealing member.

4. The light emitting device according to claim 1, wherein the sealing member includes a resin, and a content of the fluorescent material is 10 to 200 parts by mass with respect to 100 parts by mass of the resin, and a content of the fluorescent material in the first sealing member portion is 20 to 400 parts by mass with respect to the resin contained in the first sealing member portion.

5. The light emitting device according to claim 1, wherein M in the formula (I) is at least one element selected from the group consisting of titanium (Ti), zirconium (Zr), hafnium (Hf), silicon (Si), germanium (Ge), and tin (Sn).

6. The light emitting device according to claim 1, wherein the light emitting element is to emit light which has an emission peak wavelength in a range of 380 nm to 485 nm.

7. The light emitting device according to claim 1, wherein the fluorescent material further includes a fluorescent material to absorb light in a wavelength range of 380 nm to 485 nm and emit green to yellow light which has an emission peak wavelength in a range of 495 nm to 590 nm.

8. The light emitting device according to claim 7, wherein the fluorescent material to emit light of green to yellow color includes a β-sialon fluorescent material represented by a composition formula of $(Si,Al)_6(O,N)_8$:Eu, a thiogallate fluorescent material represented by a composition formula of $SrGa_2S_4$:Eu, a halosilicate fluorescent material represented by a composition formula of $(Ca,Sr,Ba,Zn)_8MgSi_4O_{16}(F,Cl,Br,I)_2$:Eu, or a rare earth aluminate fluorescent material represented by a composition formula $(Y,Lu)_3(Al,Ga)_5O_{12}$:Ce.

9. The light emitting device according to claim 7, wherein a mass ratio of the fluorescent material to emit green to yellow light to the fluoride fluorescent material is 5:95 to 95:5.

10. An image display device comprising at least one light emitting device according to claim 1.

11. The light emitting device according to claim 1, wherein a material of the first binder portion is the same as a material of the second binder portion.

* * * * *